United States Patent
More et al.

(10) Patent No.: US 11,522,062 B2
(45) Date of Patent: Dec. 6, 2022

(54) METHOD OF MANUFACTURING AN ETCH STOP LAYER AND AN INTER-LAYER DIELECTRIC ON A SOURCE/DRAIN REGION

(71) Applicant: Taiwan Semiconductor Manufacturing Co., Ltd., Hsinchu (TW)

(72) Inventors: Shahaji B. More, Hsinchu (TW); Chandrashekhar Prakash Savant, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 24 days.

(21) Appl. No.: 17/145,550

(22) Filed: Jan. 11, 2021

(65) Prior Publication Data

US 2022/0052169 A1 Feb. 17, 2022

Related U.S. Application Data

(60) Provisional application No. 63/082,537, filed on Sep. 24, 2020, provisional application No. 63/065,571, filed on Aug. 14, 2020.

(51) Int. Cl.
*H01L 29/66* (2006.01)
*H01L 21/02* (2006.01)
(Continued)

(52) U.S. Cl.
CPC .... *H01L 29/41791* (2013.01); *H01L 21/0234* (2013.01); *H01L 21/02164* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 8,431,453 B2  4/2013  Huang et al.
9,634,141 B1  4/2017  Wang et al.
(Continued)

FOREIGN PATENT DOCUMENTS

KR   20200045398 A   5/2020
TW       201239984 A  10/2012
(Continued)

*Primary Examiner* — Younes Boulghassoul
(74) *Attorney, Agent, or Firm* — Slater Matsil, LLP

(57) ABSTRACT

In an embodiment, a device includes: a gate structure over a substrate; a gate spacer adjacent the gate structure; a source/drain region adjacent the gate spacer; a first inter-layer dielectric (ILD) on the source/drain region, the first ILD having a first concentration of an impurity; and a second ILD on the first ILD, the second ILD having a second concentration of the impurity, the second concentration being less than the first concentration, top surfaces of the second ILD, the gate spacer, and the gate structure being coplanar; and a source/drain contact extending through the second ILD and the first ILD, the source/drain contact coupled to the source/drain region.

20 Claims, 18 Drawing Sheets

(51) Int. Cl.
*H01L 29/417* (2006.01)
*H01L 29/78* (2006.01)
*H01L 29/08* (2006.01)
*H01L 29/40* (2006.01)
*H01L 29/49* (2006.01)

(52) U.S. Cl.
CPC .. *H01L 21/02247* (2013.01); *H01L 21/02271* (2013.01); *H01L 21/02323* (2013.01); *H01L 21/02329* (2013.01); *H01L 21/02337* (2013.01); *H01L 21/02348* (2013.01); *H01L 29/0847* (2013.01); *H01L 29/401* (2013.01); *H01L 29/4983* (2013.01); *H01L 29/6656* (2013.01); *H01L 29/66795* (2013.01); *H01L 29/785* (2013.01); *H01L 29/7851* (2013.01); *H01L 29/66545* (2013.01)

(58) Field of Classification Search
CPC ........... H01L 27/1211; H01L 27/10826; H01L 27/10879; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 21/02329; H01L 21/02332; H01L 21/02247; H01L 21/02323; H01L 21/02326; H01L 21/02164
See application file for complete search history.

(56) References Cited

U.S. PATENT DOCUMENTS

| | | |
|---|---|---|
| 11,075,283 B2 | 7/2021 | Wu et al. |
| 11,114,336 B2 | 9/2021 | Chen |
| 2017/0110577 A1* | 4/2017 | Wang .................. H01L 23/5226 |
| 2020/0006065 A1* | 1/2020 | Kao .................. H01L 21/02337 |
| 2020/0126868 A1 | 4/2020 | Wang et al. |

FOREIGN PATENT DOCUMENTS

| | | |
|---|---|---|
| TW | 201327687 A | 7/2013 |
| TW | 201714217 A | 4/2017 |
| TW | 202017014 A | 5/2020 |
| TW | 202029351 A | 8/2020 |

* cited by examiner

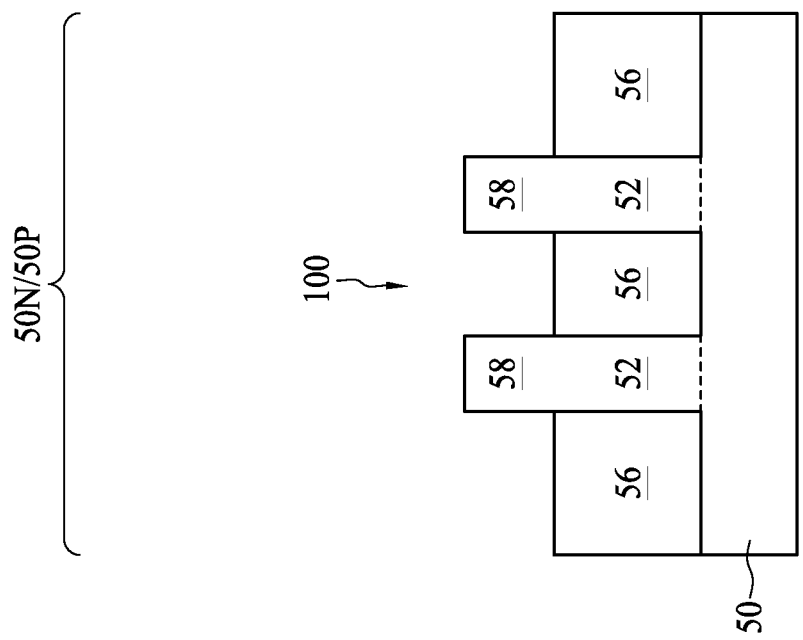
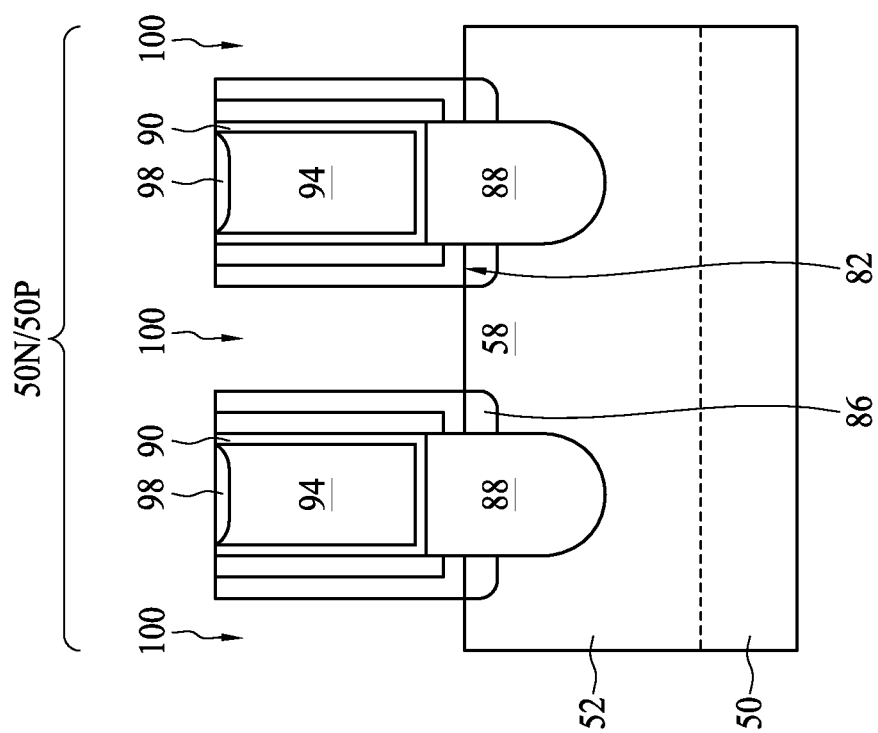
Figure 11A
Figure 11B

METHOD OF MANUFACTURING AN ETCH STOP LAYER AND AN INTER-LAYER DIELECTRIC ON A SOURCE/DRAIN REGION

PRIORITY CLAIM AND CROSS-REFERENCE

This application claims the benefit of U.S. Provisional Application No. 63/082,537, filed on Sep. 24, 2020, and U.S. Provisional Application No. 63/065,571, filed on Aug. 14, 2020, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 14B are various views of intermediate stages in the manufacturing of FinFETs, in accordance with some embodiments.

DETAILED DESCRIPTION

Figure 1:
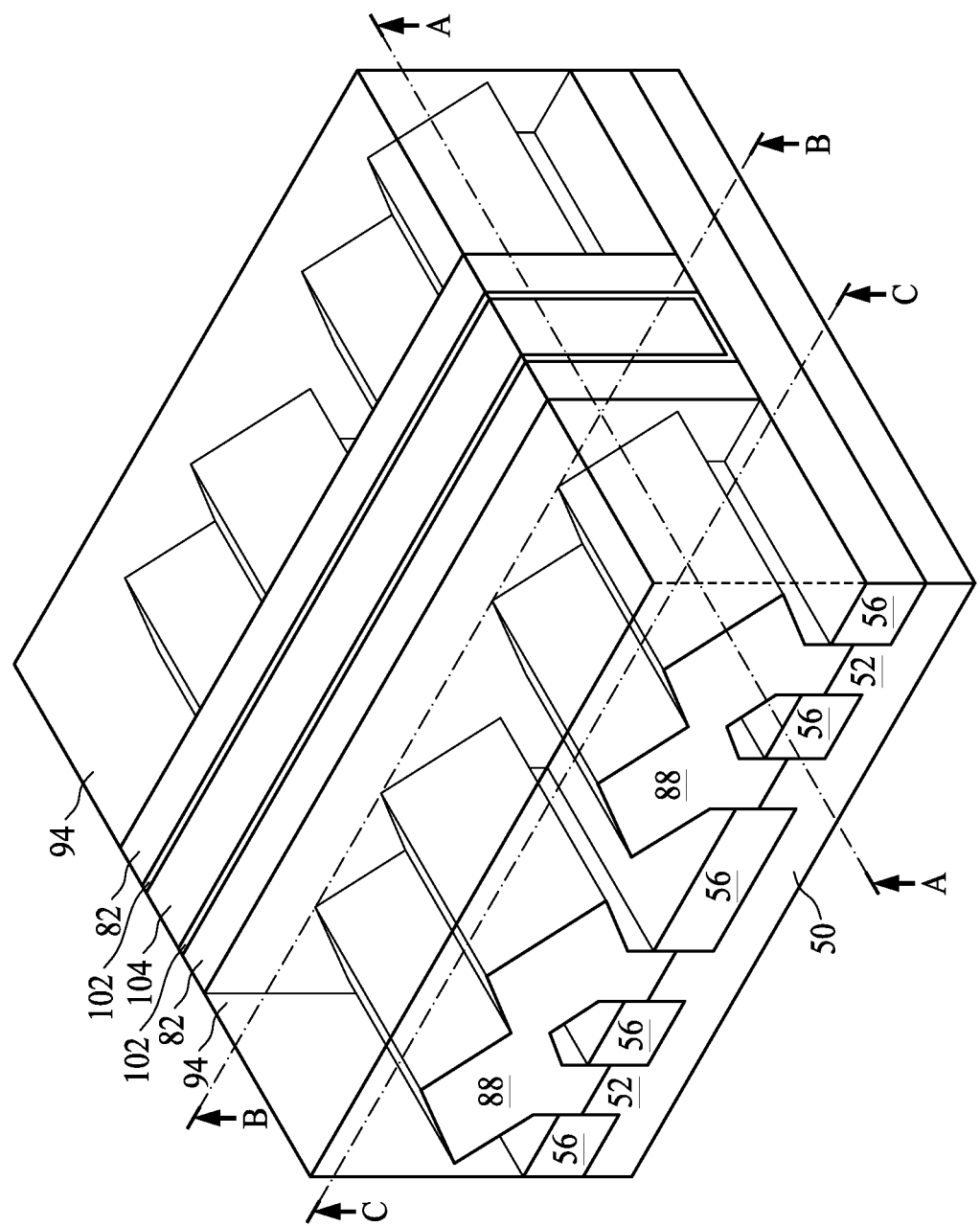
FIG. 1 illustrates an example of a FinFET in a three-dimensional view.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, a contact etch stop layer (CESL) is deposited and then treated with a nitridation treatment process to increase its nitrogen concentration. An inter-layer dielectric (ILD) is formed over the CESL and then treated with an oxide curing process to reduce its impurity concentration. The combination of the nitridation treatment process and the oxide curing process helps form an ILD that adheres well to underlying layers, and also has sufficient barrier ability to protect the underlying layers from oxidation.

FIG. 1 illustrates an example of simplified Fin Field-Effect Transistors (FinFETs) in a three-dimensional view, in accordance with some embodiments. Some other features of the FinFETs (discussed below) are omitted for illustration clarity. The illustrated FinFETs may be electrically connected or coupled in a manner to operate as, for example, one transistor or multiple transistors, such as two transistors.

The FinFETs include fins 52 extending from a substrate 50. Shallow trench isolation (STI) regions 56 are disposed over the substrate 50, and the fins 52 protrude above and from between neighboring STI regions 56. Although the STI regions 56 are described/illustrated as being separate from the substrate 50, as used herein the term "substrate" may be used to refer to just the semiconductor substrate or a semiconductor substrate inclusive of isolation regions. Additionally, although the fins 52 are illustrated as being a single, continuous material of the substrate 50, the fins 52 and/or the substrate 50 may include a single material or a plurality of materials. In this context, the fins 52 refer to the portions extending between the neighboring STI regions 56.

Gate dielectrics 102 are along sidewalls and over top surfaces of the fins 52, and gate electrodes 104 are over the gate dielectrics 102. Source/drain regions 88 are disposed in opposite sides of the fin 52 with respect to the gate dielectrics 102 and gate electrodes 104. Gate spacers 82 separate the source/drain regions 88 from the gate dielectrics 102 and gate electrodes 104. An ILD 94 is disposed over the source/drain regions 88 and STI regions 56. In embodiments where multiple transistors are formed, the source/drain regions 88 may be shared between various transistors. In embodiments where one transistor is formed from multiple fins 52, neighboring source/drain regions 88 may be electrically connected, such as through merging the source/drain regions 88 by epitaxial growth, or through coupling the source/drain regions 88 with a same source/drain contact.

FIG. 1 further illustrates several reference cross-sections. Cross-section A-A and is along a longitudinal axis of a fin 52 and in a direction of, for example, a current flow between the source/drain regions 88 of the FinFETs. Cross-section B-B is perpendicular to cross-section A-A and is along a longitudinal axis of a gate electrode 104 and in a direction, for example, perpendicular to the direction of current flow between the source/drain regions 88 of the FinFETs. Cross-section C-C is parallel to cross-section B-B and extends through the source/drain regions 88 of the FinFETs. Subsequent figures refer to these reference cross-sections for clarity.

Figure 2:
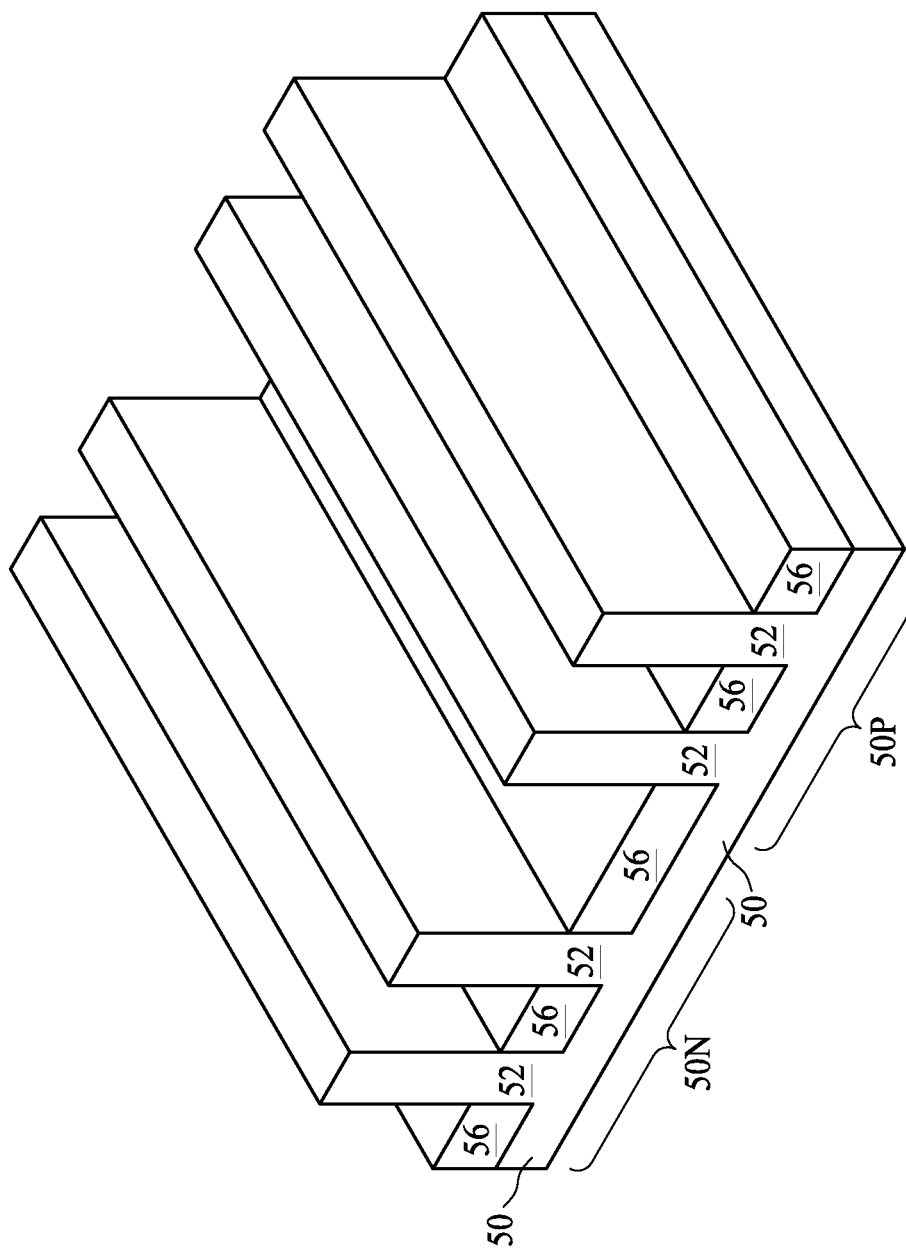
Figure 3:
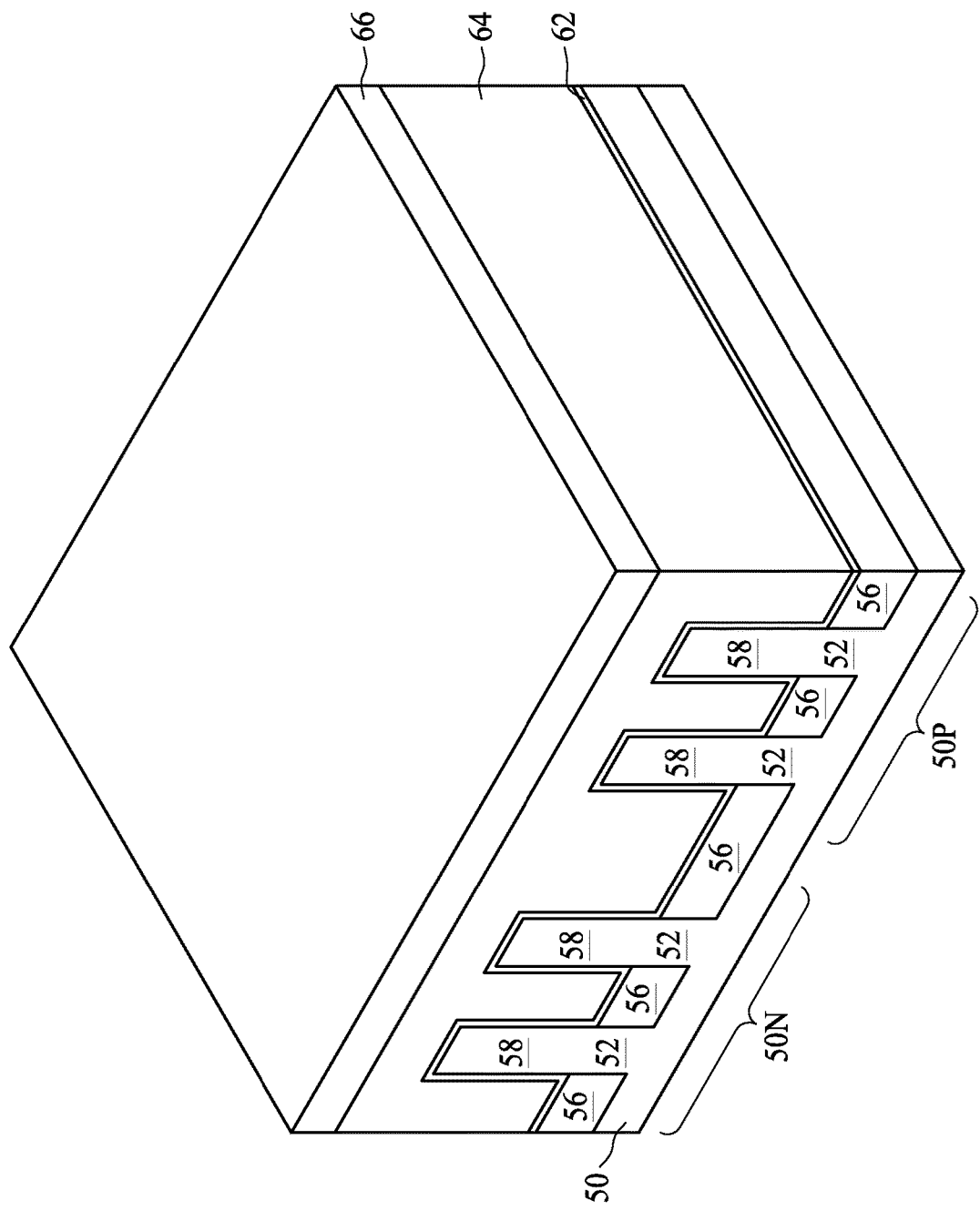

FIGS. 2 through 14B are various views of intermediate stages in the manufacturing of FinFETs, in accordance with some embodiments. FIGS. 2 and 3 are three-dimensional views. FIGS. 5A, 6A, 7A, 8A, 9A, 10A, 11A, 12A, 13A, and 14A are cross-sectional views illustrated along reference cross-section A-A in FIG. 1, except three gate structures are shown. FIGS. 5B, 6B, 7B, 8B, 9B, 10B, 11B, 12B, 13B, and 14B are cross-sectional views illustrated along reference cross-section B-B in FIG. 1, except only two fins 52 are shown. FIGS. 5C, 5D, 9C, and 9D are cross-sectional views illustrated along reference cross-section C-C in FIG. 1, except only two fins 52 are shown.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or a n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P, and any number of device features (e.g., other active devices, doped regions, isolation structures, etc.) may be disposed between the n-type region 50N and the p-type region 50P.

Fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

STI regions 56 are formed over the substrate 50 and between neighboring fins 52. As an example to form the STI regions 56, an insulation material can be formed over the substrate 50 and between neighboring fins 52. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the fins 52. Although the STI regions 56 are illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner. A removal process is then applied to the insulation material to remove excess insulation material over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material are coplanar (within process variations) after the planarization process is complete. In embodiments in which a mask remains on the fins 52, the planarization process may expose the mask or remove the mask such that top surfaces of the mask or the fins 52, respectively, and the insulation material are coplanar (within process variations) after the planarization process is complete. The insulation material is recessed to form the STI regions 56. The insulation material is then recessed such that upper portions of the fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material (e.g., etches the material of the insulation material at a faster rate than the material of the fins 52). For example, an oxide removal using, for example, dilute hydrofluoric (dHF) acid may be used, The process described with respect to FIG. 2 is just one example of how the fins 52 may be formed. In some embodiments, the fins 52 may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 can be recessed, and a material different from the fins 52 may be epitaxially grown over the recessed material. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., a NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further, appropriate wells (not shown) may be formed in the fins 52 and/or the substrate 50. In some embodiments, a p-type well may be formed in the n-type region 50N, and a n-type well may be formed in the p-type region 50P. In some embodiments, p-type well or a n-type well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P. The photoresist can be formed by using a spin-on technique and can be patterned using acceptable photolithography techniques. Once the photoresist is patterned, a n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than about $10^{18}$ cm$^{-3}$, such as in the range of about $10^{16}$ cm$^{-3}$ to about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm-3, such as in the range of about $10^{16}$ cm$^{-3}$ to about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

In FIG. 3, a dummy dielectric layer 62 is formed on the fins 52. The dummy dielectric layer 62 may be, for example, silicon oxide, silicon nitride, a combination thereof, or the like, and may be deposited or thermally grown according to acceptable techniques. A dummy gate layer 64 is formed over the dummy dielectric layer 62, and a mask layer 66 is formed over the dummy gate layer 64. The dummy gate layer 64 may be deposited over the dummy dielectric layer 62 and then planarized, such as by a CMP. The mask layer 66 may be deposited over the dummy gate layer 64. The dummy gate layer 64 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 64 may be deposited by physical vapor deposition (PVD), CVD, sputter deposition, or other techniques for depositing the selected material. The dummy gate layer 64 may be made of other materials that have a high etching selectivity from the etching of isolation regions, e.g., the STI regions 56 and/or the dummy dielectric layer 62. The mask layer 66 may include one or more layers of, for example, silicon nitride, silicon oxynitride, or the like. In this example, a single dummy gate layer 64 and a single mask layer 66 are formed across the n-type region 50N and the p-type region 50P. In the illustrated embodiment, the dummy dielectric layer 62 covers the STI regions 56, extending over the STI regions 56 and between the dummy gate layer 64 and the STI regions 56. In another embodiment, the dummy dielectric layer 62 covers only the fins 52.

Figure 4:
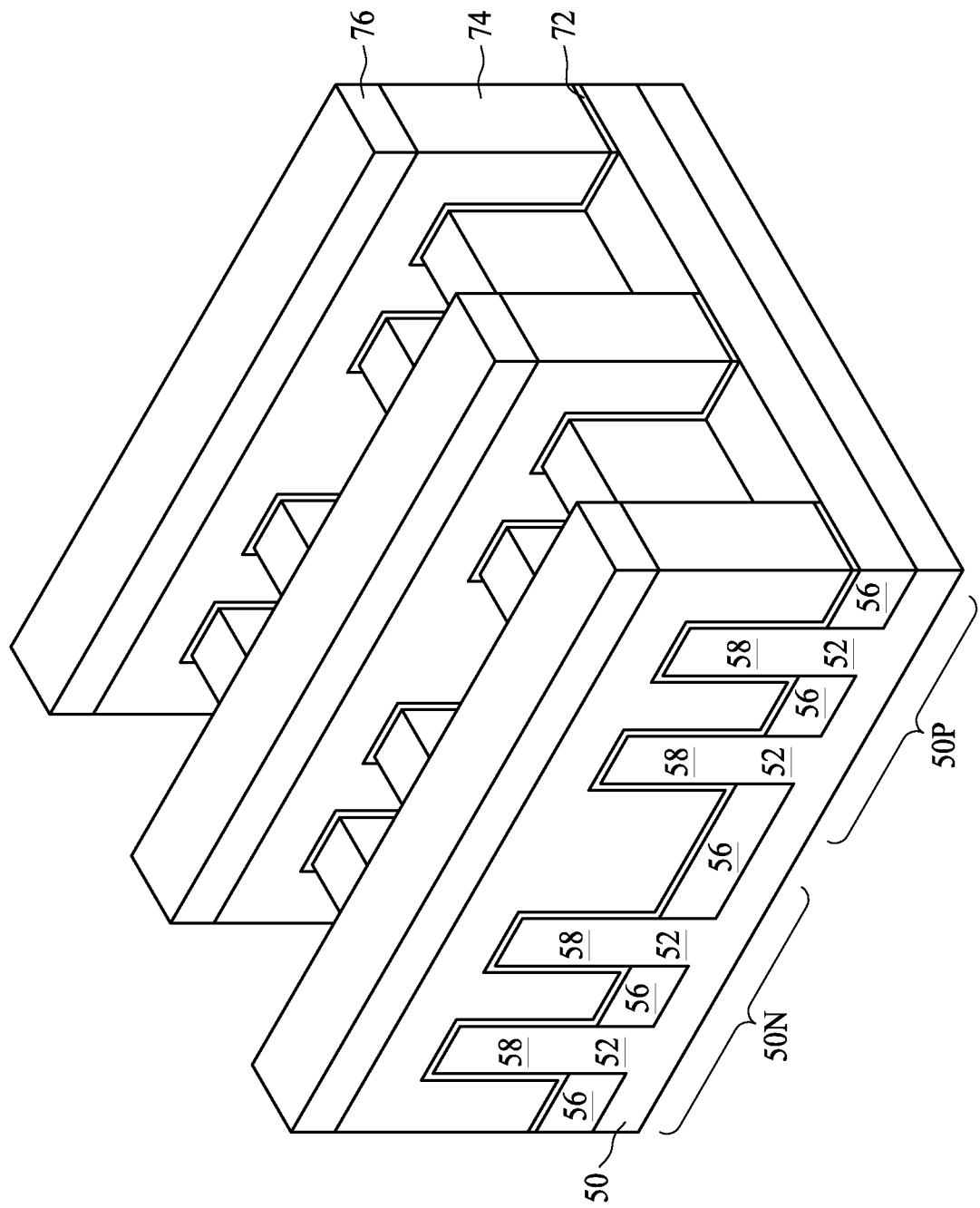

In FIG. 4, the mask layer 66 may be patterned using acceptable photolithography and etching techniques to form masks 76. The pattern of the masks 76 then may be transferred to the dummy gate layer 64 to form dummy gates 74. In some embodiments, the pattern of the masks 76 is also transferred to the dummy dielectric layer 62 by an acceptable etching technique to form dummy dielectrics 72. The dummy gates 74 cover respective channel regions 58 of the fins 52. The pattern of the masks 76 may be used to physically separate each of the dummy gates 74 from adjacent dummy gates 74. The dummy gates 74 may also have a lengthwise direction substantially perpendicular to the lengthwise direction of the fins 52.

FIGS. 5A through 14B illustrate various additional steps in the manufacturing of embodiment devices. FIGS. 5A through 14B illustrate features in either of the n-type region 50N and the p-type region 50P. For example, the structures illustrated in FIGS. 5A through 14B may be applicable to both the n-type region 50N and the p-type region 50P. Differences (if any) in the structures of the n-type region 50N and the p-type region 50P are described in the text accompanying each figure.

Figure 5B:
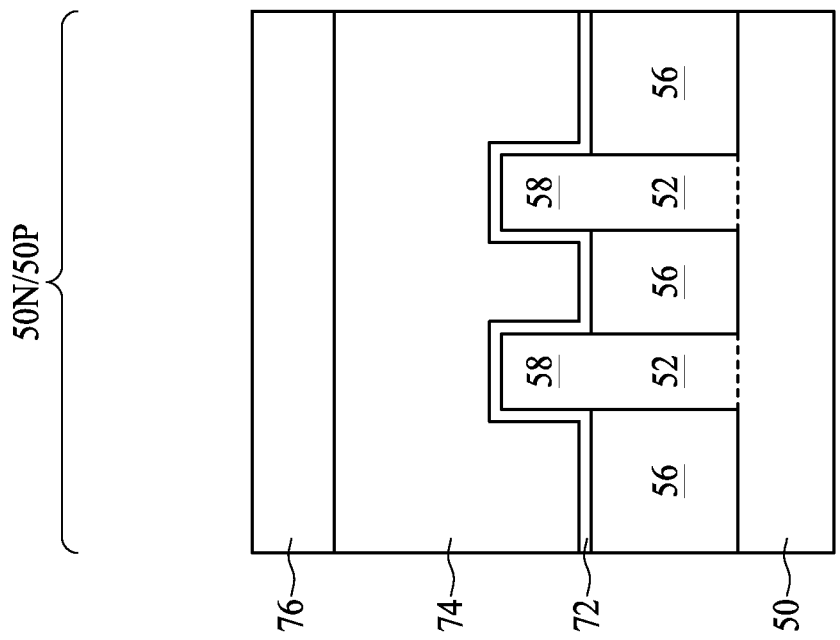
Figure 5A:
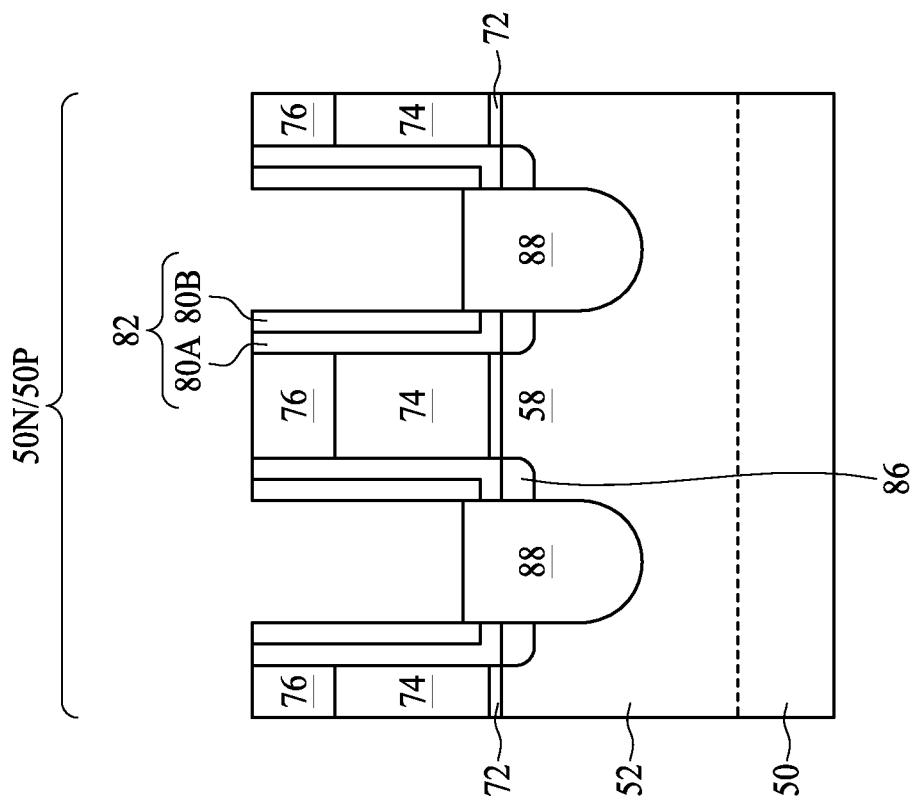

In FIGS. 5A and 5B, gate spacers 82 are formed on sidewalls of the dummy gates 74 and the masks 76. The gate spacers 82 may be formed by conformally depositing one or more insulating material(s) and subsequently etching the insulating material(s). The insulating material(s) may be formed of low-k dielectric materials such as silicon oxide, silicon nitride, silicon carbonitride, silicon oxycarbonitride, a combination thereof, or the like, which may be formed by a conformal deposition process such as chemical vapor deposition (CVD), plasma enhanced chemical vapor deposition (PECVD), atomic layer deposition (ALD), or the like. The insulating material(s), when etched, have portions left on the sidewalls of the dummy gates 74 and the masks 76 (hence forming the gate spacers 82). After the etching, the gate spacers 82 can have straight sidewalls (as illustrated) or can have curved sidewalls (not illustrated).

According to various embodiments, the gate spacers 82 each include multiple layer(s), e.g., a first spacer layer 80A and a second spacer layer 80B. In some embodiments, the first spacer layers 80A and the second spacer layers 80B are each formed of silicon oxycarbonitride (e.g., $SiO_xN_yC_{1-x-y}$, where x and y are in the range of 0 to 1). For example, the first spacer layers 80A and the second spacer layers 80B can each be formed of silicon oxycarbonitride having a composition of from about 4 at. % to about 10 at. % oxygen, from about 10 at. % to about 45 at. % nitrogen, and from about 5 at. % to about 20 at. % carbon.

The silicon oxycarbonitride of the first spacer layers 80A has a different composition than the silicon oxycarbonitride of the second spacer layers 80B. The first spacer layers 80A can be composed of more nitrogen (by atomic percent) than the second spacer layers 80B, and the second spacer layers 80B can be composed of more oxygen (by atomic percent) than the first spacer layers 80A. Forming the first spacer layers 80A of nitrogen-rich silicon oxycarbonitride increases its etching selectivity with the dummy dielectrics 72, relative an etching process (discussed in greater detail below) that will be used to remove the dummy dielectrics 72 in subsequent processing. Forming the second spacer layers 80B of oxygen-rich silicon oxycarbonitride decreases the relative permittivity (e.g., dielectric constant, also known as the k-value) of the second spacer layers 80B, allowing the gate spacers 82 to have greater electrical isolation performance. In some embodiments, the silicon oxycarbonitride of the first spacer layers 80A has a k-value in the range of about 4.8 to about 5.5 and the silicon oxycarbonitride of the second spacer layers 80B has a k-value in the range of about 3.8 to about 5.

The silicon oxycarbonitride of the first spacer layers 80A and the second spacer layers 80B can be deposited using dielectric material precursors comprising a silicon source precursor (e.g., hexachlorodisilane ($Si_2Cl_6$)), an oxygen source precursor (e.g., oxygen gas ($O_2$)), a carbon source precursor (e.g., propylene ($C_3H_6$)), and a nitrogen source precursor (e.g., ammonia ($NH_3$)). In embodiments where the deposition is by CVD, the compositions of the spacer layers can be controlled by controlling the flow rates of the source precursors during CVD. After formation, an acceptable etch process, such as a dry etch, a wet etch, the like, or a combination thereof, may be performed to pattern the spacer layers. The etch may be anisotropic. For example, the spacer layers can be patterned by anisotropically etching the material of the second spacer layers 80B using the material of the first spacer layers 80A as an etch stop layer, and then anisotropically etching the material of the first spacer layers 80A using the second spacer layers 80B as an etching mask.

During or after the formation of the gate spacers 82, implants for lightly doped source/drain (LDD) regions 86 may be performed. In the embodiments with different device types, similar to the implants for the wells previously discussed, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The LDD regions 86 may have a concentration of impurities in the range of about $10^{15}$ $cm^{-3}$ to about $10^{19}$ $cm^{-3}$. An anneal may be used to repair implant damage and to activate the implanted impurities.

Epitaxial source/drain regions 88 are then formed in the fins 52. The epitaxial source/drain regions 88 are formed in the fins 52 such that each dummy gate 74 (and corresponding channel region 58) is disposed between respective neighboring pairs of the epitaxial source/drain regions 88. In some embodiments the epitaxial source/drain regions 88 may extend into, and may also penetrate through, the fins 52. In some embodiments, the gate spacers 82 are used to separate the epitaxial source/drain regions 88 from the dummy gates 74 by an appropriate lateral distance so that the epitaxial source/drain regions 88 do not short out subsequently formed gates of the resulting FinFETs. A material of the epitaxial source/drain regions 88 may be selected to exert stress in the respective channel regions 58, thereby improving performance.

The epitaxial source/drain regions 88 in the n-type region 50N may be formed by masking the p-type region 50P and etching source/drain regions of the fins 52 in the n-type region 50N to form recesses in the fins 52. Then, the epitaxial source/drain regions 88 in the n-type region 50N are epitaxially grown in the recesses. The epitaxial source/drain regions 88 may include any acceptable material, such as appropriate for n-type FinFETs. For example, if the fins 52 are silicon, the epitaxial source/drain regions 88 in the n-type region 50N may include materials exerting a tensile strain in the channel regions 58, such as silicon, silicon carbide, phosphorous doped silicon carbide, silicon phosphide, or the like. The epitaxial source/drain regions 88 in the n-type region 50N may have surfaces raised from respective surfaces of the fins 52 and may have facets.

The epitaxial source/drain regions 88 in the p-type region 50P may be formed by masking the n-type region 50N and etching source/drain regions of the fins 52 in the p-type region 50P to form recesses in the fins 52. Then, the epitaxial source/drain regions 88 in the p-type region 50P are epitaxially grown in the recesses. The epitaxial source/drain regions 88 may include any acceptable material, such as appropriate for p-type FinFETs. For example, if the fins 52 are silicon, the epitaxial source/drain regions 88 in the p-type region 50P may comprise materials exerting a compressive strain in the channel regions 58, such as silicon-germanium, boron doped silicon-germanium, germanium, germanium tin, or the like. The epitaxial source/drain regions 88 in the p-type region 50P may have surfaces raised from respective surfaces of the fins 52 and may have facets.

The epitaxial source/drain regions 88 and/or the fins 52 may be implanted with dopants to form source/drain regions, similar to the process previously discussed for forming the LDD regions 86, followed by an anneal. The source/drain regions may have an impurity concentration of between about $10^{19}$ $cm^{-3}$ and about $10^{21}$ $cm^{-3}$. The n-type and/or p-type impurities for the source/drain regions may be any of the impurities previously discussed. In some embodiments, the epitaxial source/drain regions 88 may be in situ doped during growth.

Figure 5D:
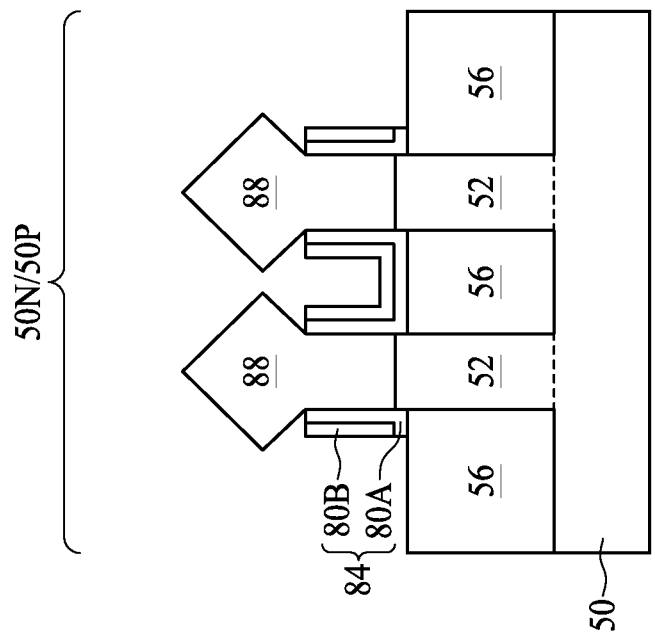
Figure 5C:
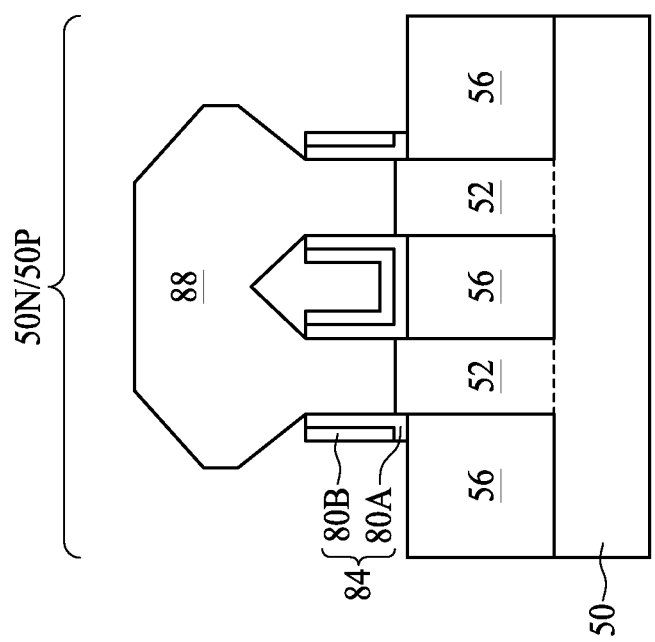

As a result of the epitaxy processes used to form the epitaxial source/drain regions 88 in the n-type region 50N and the p-type region 50P, upper surfaces of the epitaxial source/drain regions have facets which expand laterally outward beyond sidewalls of the fins 52. In some embodiments, these facets cause adjacent epitaxial source/drain regions 88 to merge as illustrated by FIG. 5C. In some embodiments, adjacent epitaxial source/drain regions 88 remain separated after the epitaxy process is completed as illustrated by FIG. 5D. The spacer etch used to form the gate spacers 82 may be adjusted to also form fin spacers 84 on sidewalls of the fins 52. In the illustrated embodiment, the fin spacers 84 cover a portion of the sidewalls of the fins 52 that extend above the STI regions 56, thereby blocking the epitaxial growth. The fin spacers 84 between adjacent fins 52 may be merged (as shown), or may be etched so that they are separated. In another embodiment, the spacer etch used to form the gate spacers 82 is adjusted to not form the gate spacers 82 on the STI regions 56, so as to allow the epitaxially grown regions to extend to the surface of the STI regions 56.

Figure 6B:
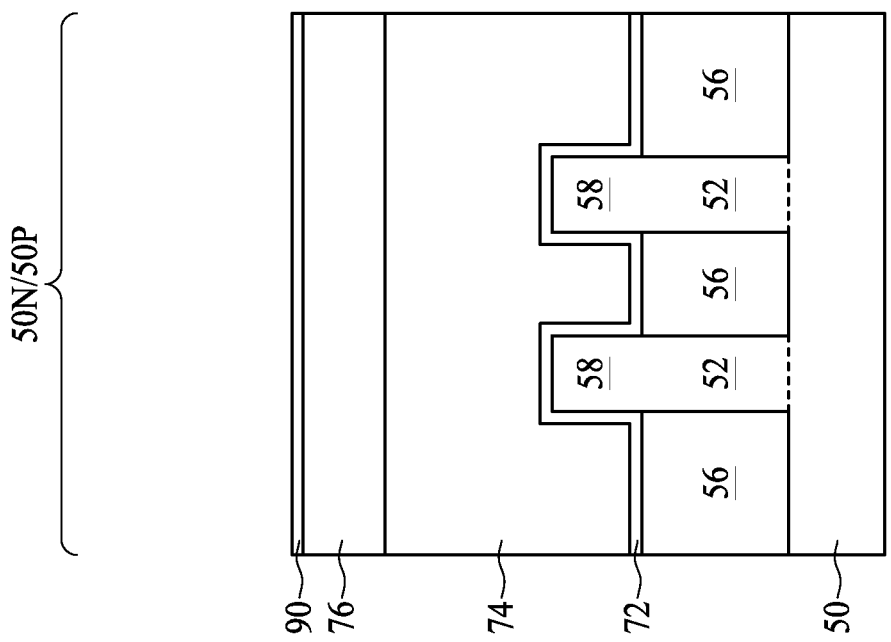
Figure 6A:
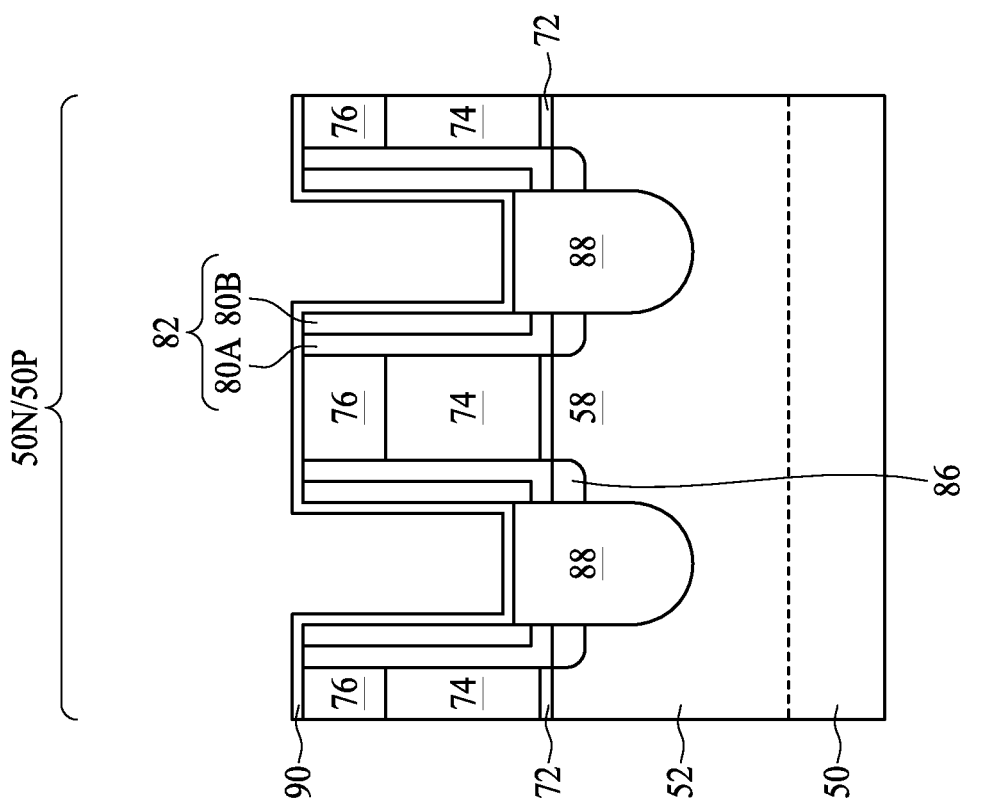

In FIGS. 6A and 6B, a CESL 90 is formed on the epitaxial source/drain regions 88, the gate spacers 82, and the masks 76. The CESL 90 is formed of a dielectric material having a different etch rate than the material of a subsequently formed ILD layer (discussed in greater detail below). For example, the CESL 90 may be formed of low-k dielectric materials such as silicon oxide, silicon nitride, silicon carbonitride, silicon oxycarbonitride, a combination thereof, or the like, which may be formed by a conformal deposition process such as chemical vapor deposition (CVD), plasma enhanced chemical vapor deposition (PECVD), atomic layer deposition (ALD), or the like. In some embodiments, the CESL 90 is formed of silicon nitride. For example, the CESL 90 may be formed of silicon nitride having an initial composition of from about 15 at. % to about 55 at. % nitrogen. The CESL 90 may be formed to a small thickness, such as a thickness in the range of about 2 nm to about 10 nm.

Figure 7B:
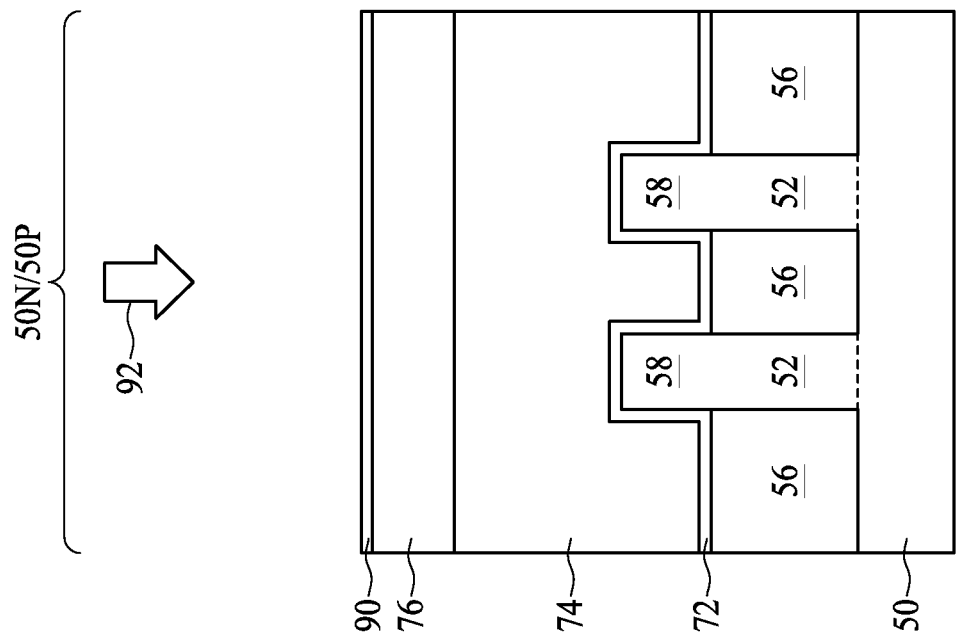
Figure 7A:
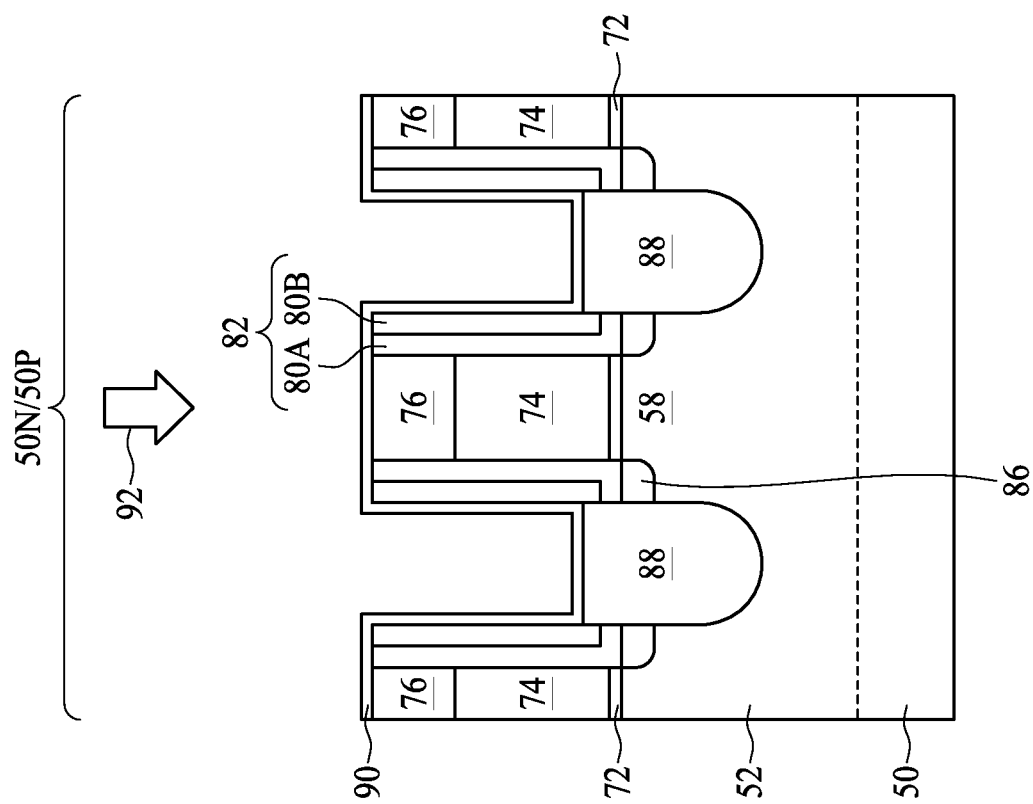

In FIGS. 7A and 7B, a nitridation treatment process 92 is performed to increase the nitrogen concentration (by atomic percent) of the CESL 90. The nitridation treatment process 92 can increase the nitrogen concentration of the CESL 90 by up to about 25 at. %. Continuing the previous example, when the CESL 90 is formed of silicon nitride having a small thickness, it may have a final composition of from about 15 at. % to about 55 at. % nitrogen after the nitridation treatment process 92. More specifically, in some embodiments, the CESL 90 has a final composition of from about 20 at. % to about 40 at. % nitrogen after the nitridation treatment process 92. Silicon nitride of a large nitrogen concentration can help avoid or reduce oxidation of underlying features, e.g., the epitaxial source/drain regions 88, in subsequent processing. After the nitridation treatment process 92, the CESL 90 has a greater nitrogen concentration (by atomic percent) than the spacer layers of the gate spacers 82. In some embodiments, the CESL 90 has a lesser nitrogen concentration (by atomic percent) than the spacer layers of the gate spacers 82 before the nitridation treatment process 92, and has a greater nitrogen concentration (by atomic percent) than the spacer layers of the gate spacers 82 after the nitridation treatment process 92. In addition to helping avoid or reduce oxidation of underlying features in subsequent processing, the nitridation treatment process 92 may also cause diffusion of hydrogen-based species into the CESL 90, toward the interface of the CESL 90 and underlying features. These hydrogen-based species can also passivate interfacial dangling bonds and/or terminate bulk oxygen vacancies at the interface of the CESL 90 and underlying features. Defects in the underlying features may thus be repaired.

In some embodiments, the nitridation treatment process 92 is an ammonia soak process, in which the CESL 90 is exposed to ammonia ($NH_3$). The ammonia soak process may be performed in a chamber such as an etch chamber. A gas source is dispensed in the chamber. The gas source includes ammonia gas and an carrier gas. The carrier gas may be an inert gas such as Ar, He, Xe, Ne, Kr, Rn, the like, or combinations thereof. In some embodiments, the ammonia gas is from about 1% to about 10% of the gas source, and the carrier gas is from about 90% to about 99% of the gas source. The gas source may be dispensed at a flow rate of from about 200 sccm to about 2000 sccm. The nitrogen in the ammonia readily bonds with any open bonds of silicon atoms of the CESL 90, thereby nitrating the CESL 90 and producing hydrogen byproducts, which can be evacuated from the chamber. The ammonia is kept in the chamber until the CESL 90 has been nitrated by a desired amount. In some embodiments, the ammonia soak process is performed at a temperature of from about 50° C. to about 500° C., and for a duration of from about 2 seconds to about 100 seconds.

In some embodiments, the nitridation treatment process 92 is a nitrogen radical treatment process, in which the CESL 90 is exposed to nitrogen free radicals. The nitrogen radical treatment process may be performed in a chamber such as an etch chamber. A gas source is dispensed in the chamber. The gas source includes a plurality of radical precursor gases and an carrier gas. The radical precursor gases include $H_2$ and $N_2$. The carrier gas may be an inert gas such as Ar, He, Xe, Ne, Kr, Rn, the like, or combinations thereof. In some embodiments, the $H_2$ is from about 1% to about 10% of the gas source, the $N_2$ is from about 1% to about 10% of the gas source, and the carrier gas is from about 90% to about 99% of the gas source. The gas source may be dispensed at a flow rate of from about 100 sccm to about 1000 sccm. A plasma is generated from the gas source. The plasma may be generated by a plasma generator such as a transformer-coupled plasma generator, inductively coupled plasma system, magnetically enhanced reactive ion etching system, electron cyclotron resonance system, remote plasma generator, or the like. The plasma generator generates radio frequency power that produces a plasma from the gas source by applying a voltage above the striking voltage to electrodes in the chamber containing the gas source. When the plasma is generated, nitrogen free radicals and corresponding ions are generated. The nitrogen free radicals readily bond with any open bonds of silicon atoms of the CESL 90, thereby nitrating the CESL 90. The nitrogen free radicals are kept in the chamber until the CESL 90 has been nitrated by a desired amount. In some embodiments, the nitrogen radical treatment process is performed at a temperature of from about 100° C. to about 500° C., for a duration of from about 1 seconds to about 100 seconds, and at a pressure of from about 0.1 Torr to about 50 Torr.

The nitridation treatment process 92 may be performed so that only an upper portion of the CESL 90 is nitrated, or may be performed so that the entire thickness of the CESL 90 is nitrated. The extent of nitration depends on the duration of the nitridation treatment process 92. When the entire thickness of the CESL 90 is nitrated, upper portions of the gate spacers 82 (e.g., some or all of the second spacer layers 80B) may also have their nitrogen concentration increased. Nitrating the gate spacers 82 may increase their k-value. As noted above, the second spacer layers 80B are initially formed with a low k-value. As a result, the gate spacers 82 may be able to maintain a desired k-value even when some nitration of the second spacer layers 80B occurs.

Figure 8B:
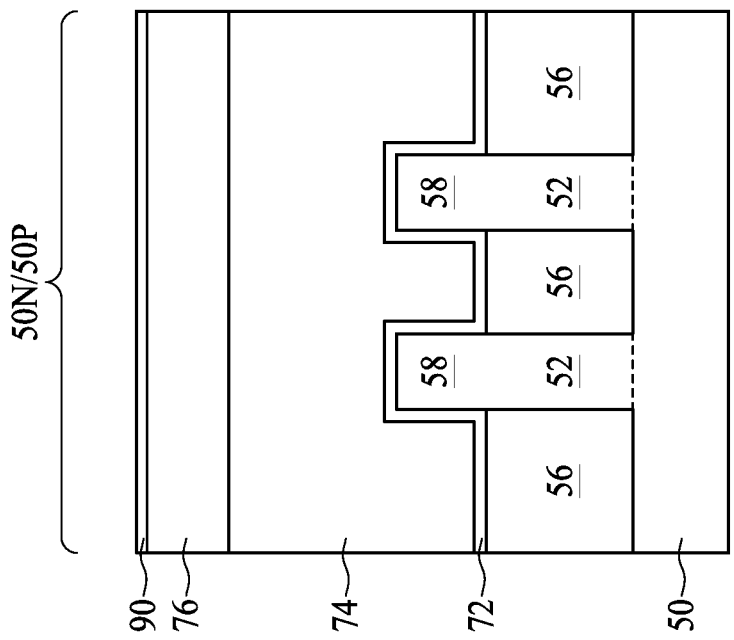
Figure 8A:
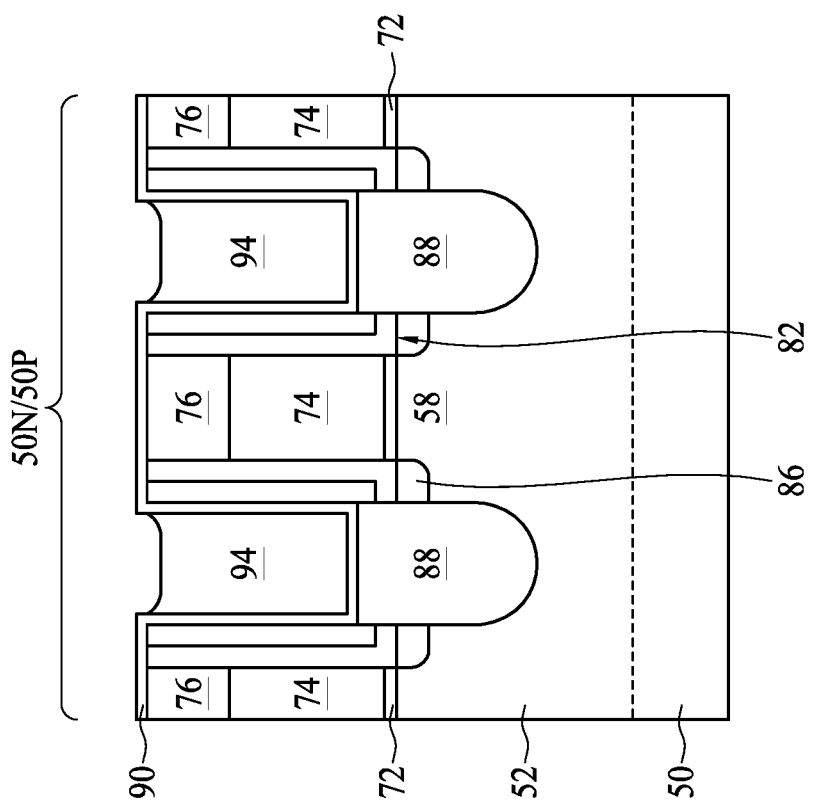

In FIGS. 8A and 8B, a first ILD 94 is deposited on the CESL 90. The first ILD 94 is formed of a dielectric material, and may be deposited by any suitable method, such as CVD, plasma-enhanced CVD (PECVD), or FCVD. Dielectric materials may include oxides such as phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, the first ILD 94 is a silicon-based oxide deposited by FCVD. Deposition (e.g., FCVD) can be performed at a low temperature, such as a temperature in the range of about 50° C. to about 180° C.

As noted above, treating the CESL 90 to increase its nitrogen concentration can help avoid or reduce oxidation of the epitaxial source/drain regions 88. Specifically, nitrating the CESL 90 helps it better block oxygen atoms from being driven into the epitaxial source/drain regions 88 when depositing the first ILD 94 (e.g., a silicon-based oxide), as the presence of increased nitrogen can help block oxidation. Oxidation of the epitaxial source/drain regions 88 in subsequent processing can thus be avoided or reduced, which can improve the performance of the FinFETs.

FCVD can be used to deposit the first ILD 94 with plasma-based precursors such as trisilane amine (TSA), increasing the gap-filling properties of the FCVD process and allowing the first ILD 94 to be formed in gaps around the epitaxial source/drain regions 88. However, depositing the first ILD 94 by FCVD using TSA presents several challenges. According to various embodiments, treatment processes are performed to address the challenges of depositing the first ILD 94 by FCVD using TSA.

Depositing the first ILD 94 by FCVD using TSA can produce a dielectric material with a low reactive sticking coefficient (RSC), which may otherwise reduce the adhesion to the underlying layer (e.g., the CESL 90). Treating the CESL 90 with the nitridation treatment process 92 (discussed above for FIGS. 7A and 7B) before deposition of the first ILD 94 can help increase adhesion of the first ILD 94 to the CESL 90. Specifically, increasing the nitrogen concentration of the CESL 90 allows the first ILD 94 to better adsorb to the CESL 90. Thus, a desired amount of adhesion between the CESL 90 and the first ILD 94 may be achieved even when the first ILD 94 has a low RSC. The formation of gaps or voids between the first ILD 94 and the CESL 90 may thus be avoided or reduced.

Depositing the first ILD 94 by FCVD can also produce a low quality dielectric material. Specifically, it can have a low oxygen density, reducing its electrical isolation performance. Further, it can contain a large amount of impurities, e.g., H and/or N, which are bonded to silicon atoms of the first ILD 94 to form, e.g., Si—H bonds and/or Si—N bonds. These impurities provide a path for contamination diffusion (e.g., of oxygen) to the epitaxial source/drain regions 88 in subsequent processing. As will be discussed in greater detail below, one or more treatment processes will be performed on the first ILD 94 to improve its quality post-deposition, such as by removing impurities from the first ILD 94. The contamination diffusion paths to the epitaxial source/drain regions 88 can thus be reduced, helping avoid oxidation of the epitaxial source/drain regions 88 in subsequent processing.

In this embodiment, the first ILD 94 is not formed over the dummy gates 74, but rather is confined between portions of the gate spacers 82. The top surfaces of the first ILD 94 are thus disposed beneath the top surfaces of the gate spacers 82 and the masks 76, relative the substrate 50. Specifically, the first ILD 94 is deposited until the gaps around the epitaxial source/drain regions 88 are filled. Such a deposition process also causes the top surfaces of the first ILD 94 to be concave. As will be discussed in greater detail below, a high quality dielectric material may then be deposited on the first ILD 94 to complete the formation of the ILDs. In another embodiment (discussed in greater detail below), the first ILD 94 is also formed over the dummy gates 74.

Figure 9B:
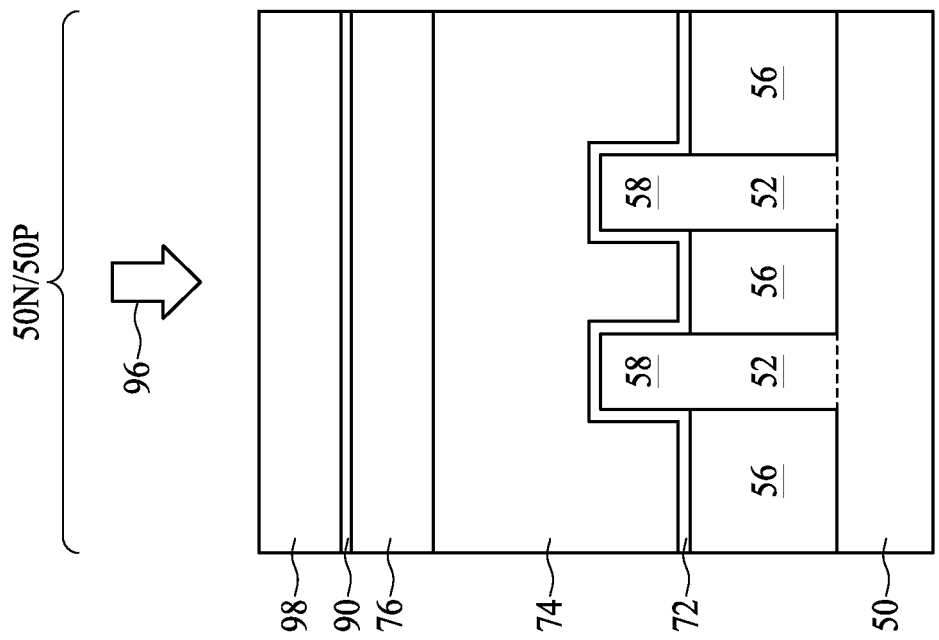
Figure 9A:
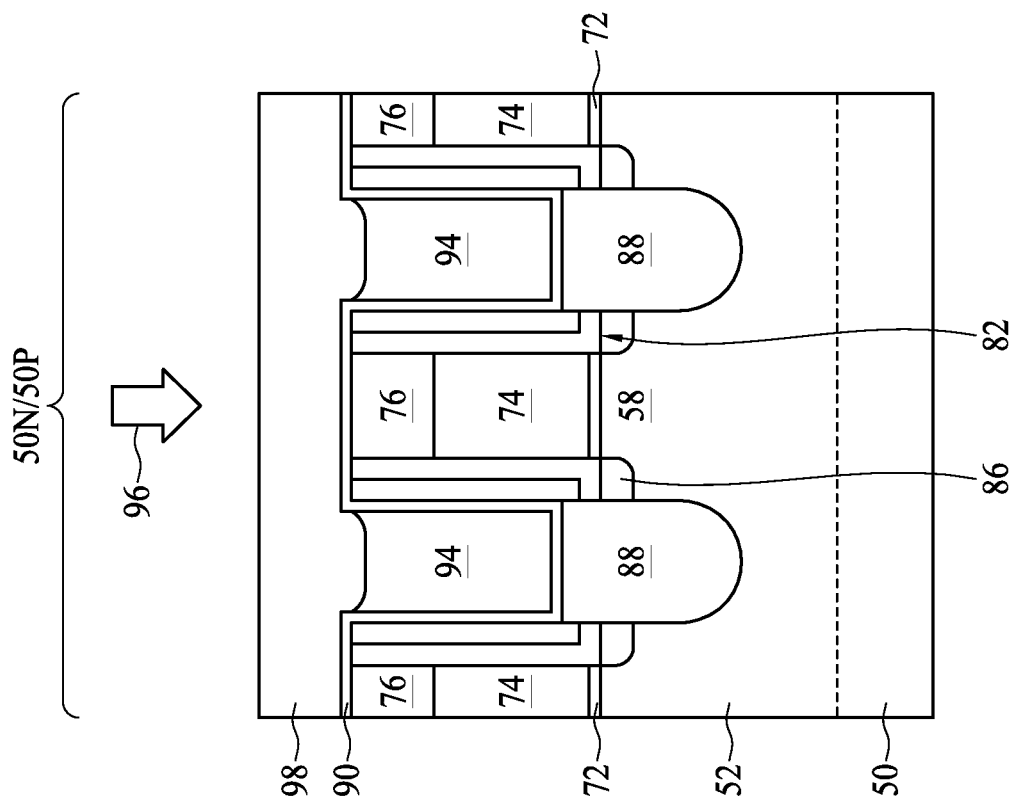
Figure 9D:
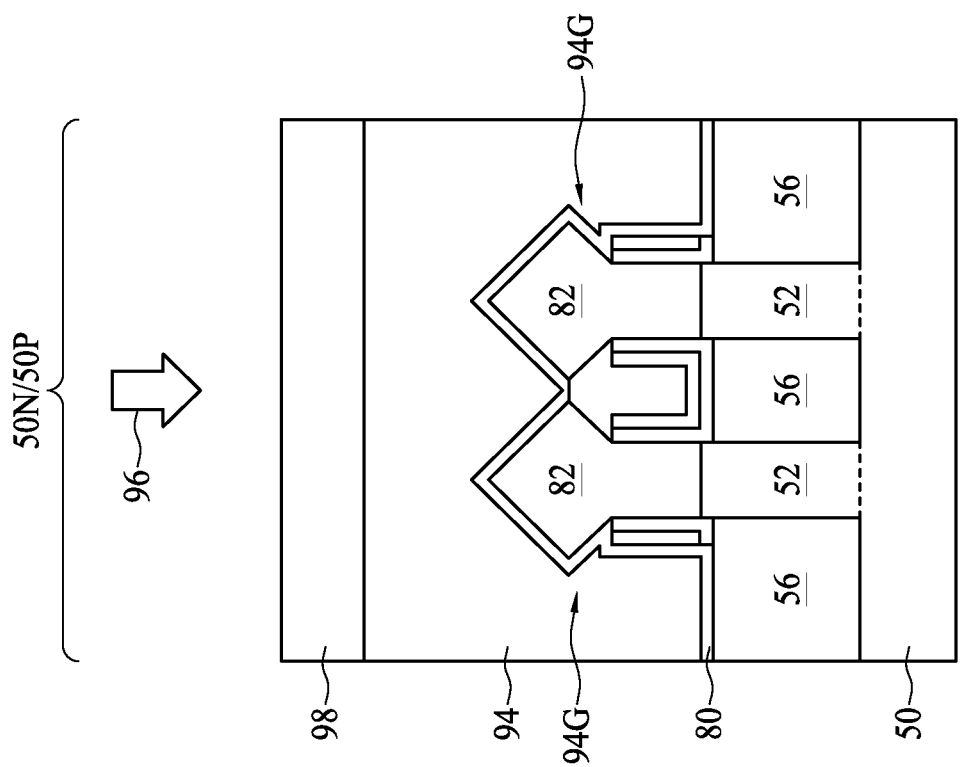
Figure 9C:
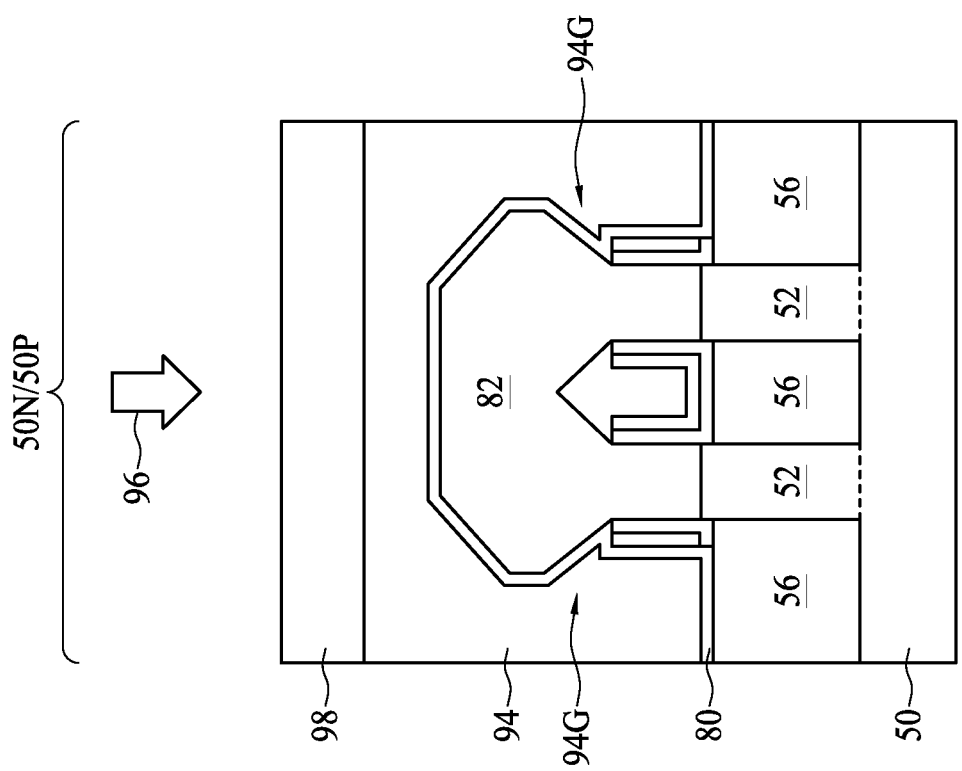

In FIGS. 9A and 9B, an oxide curing process 96 is performed to remove impurities from the first ILD 94 and increase the oxygen concentration (by atomic percent) and thus the oxygen density of the first ILD 94. The oxide curing process 96 removes impurities from the first ILD 94 by breaking bonds (e.g., Si—H bonds, Si—N bonds, etc.) between the impurities and silicon atoms of the first ILD 94. The impurities may then be outgassed, and the open bonds of silicon atoms of the first ILD 94 may then bond to oxygen. The oxygen density of the first ILD 94 may thus be increased while the impurities in the first ILD 94 are removed. The electrical isolation performance of the first ILD 94 may thus be improved. Further, reducing impurities in the first ILD 94 enhances its barrier ability, reducing contamination diffusion paths to the epitaxial source/drain regions 88, and helping avoid oxidation of the epitaxial source/drain regions 88 in subsequent processing. The oxide curing process 96 includes an ultraviolet (UV) curing process and an anneal process. Optionally, the oxide curing process 96 also includes an ozone curing process.

The ozone curing process includes exposing the first ILD 94 to ozone. The ozone curing process may be performed in a chamber such as an etch chamber. A gas source is dispensed in the chamber. The gas source includes ozone ($O_3$) gas and an carrier gas. The carrier gas may be an inert gas such as Ar, He, Xe, Ne, Kr, Rn, the like, or combinations thereof. In some embodiments, the ozone gas is from about 10% to about 40% of the gas source, and the carrier gas is from about 60% to about 90% of the gas source. The gas source may be dispensed at a flow rate of from about 1000 sccm to about 1500 sccm. The ozone breaks the bonds (e.g., Si—H bonds, Si—N bonds, etc.) between the impurities and silicon atoms of the first ILD 94, allowing the impurities to recombine with one another (e.g., to form $H_2$) and be outgassed, thereby removing the impurities from the first ILD 94. The ozone curing process is performed at a low temperature, to avoid silicon loss by out-diffusion of silicon-bonded impurities. In some embodiments, the ozone curing process is performed at a temperature of from about 50° C. to about 500° C., and for a duration of from about 50 seconds to about 1000 seconds.

The UV curing process includes exposing the first ILD 94 to UV light in an ambient. The ambient may include an inert gas such as Ar, He, Xe, Ne, Kr, Rn, the like, or combinations thereof. The UV light can have a wavelength in the range of about 250 nm to about 1250 nm. The UV curing process can be directional, although in some examples, multiple UV curing processes may be performed to achieve a more conformal treatment. The UV light breaks the bonds (e.g., Si—H bonds, Si—N bonds, etc.) between the impurities and silicon atoms of the first ILD 94, allowing the impurities to be outgassed, and thereby removing the impurities from the first ILD 94. The UV curing process is performed at a low temperature, to avoid silicon loss by out-diffusion of silicon-bonded impurities. In some embodiments, the UV curing process is performed at a temperature of from about 4° C. to about 80° C., at an energy of from about 10 eV to about 100 eV, and for a duration of from about 50 seconds to about 500 seconds.

In this embodiment, a second ILD 98 covers the first ILD 94 during the UV curing process. The second ILD 98 may be formed after the ozone curing process (if performed). The second ILD 98 is formed of a dielectric material such as silicon oxide, silicon nitride, silicon carbonitride, silicon oxycarbonitride, a combination thereof, or the like. The second ILD 98 may be formed of the same material as the first ILD 94, but by a different process. In some embodiments, the second ILD 98 is an oxide deposited by CVD. For example, CVD can be used to deposit the second ILD 98 at a low temperature using tetraethyl orthosilicate (TEOS) as a precursor. Depositing the second ILD 98 by CVD using TEOS produces a high quality dielectric material. Specifically, the second ILD 98 can be formed with a higher oxygen density and a smaller amount of impurities than the first ILD 94 is initially formed with. However, TEOS-based CVD does not have the gap-filling properties of TSA-based FCVD. Thus, in some embodiments, the first ILD 94 is deposited (using TSA-based FCVD) until the gaps 94G around the epitaxial source/drain regions 88 are filled (see FIGS. 9C and 9D) and the epitaxial source/drain regions 88 are covered, and then the second ILD 98 is deposited (using TEOS-based CVD) on the first ILD 94. The first ILD 94 may be formed to a thickness in the range of about 50 nm to about 500 nm, and the second ILD 98 may be formed to a thickness in the range of about 20 nm to about 60 nm. In some embodiments, more of the second ILD 98 is dispensed than the first ILD 94, such that more high quality dielectric material is used. In addition to being a high quality dielectric material (and thus containing less impurities), the second ILD 98 also has a higher transmittance than the first ILD 94, which helps UV light penetrate deeper into the first ILD 94 during the UV curing process. For example, the dielectric material of the second ILD 98 can have a transmittance as high as about 90%. The second ILD 98 may absorb a small enough amount of UV light that the UV light is able to penetrate to the bottoms of the trenches between the epitaxial source/drain regions 88. Thus, the upper portions of the first ILD 94 and the lower portions of the first ILD 94 may have a uniform concentration of impurities, which may be as low as zero. Efficiency of the UV curing process may thus be improved.

In some embodiments, the second ILD 98 is omitted. Omitting the second ILD 98 can reduce the quantity of processing steps, thereby decreasing manufacturing costs. When the second ILD 98 is omitted, some absorption of UV light may occur in the first ILD 94, such that the UV light may not be able to penetrate to the bottoms of the trenches between the epitaxial source/drain regions. Thus, upper portions of the first ILD 94 can be exposed to more of the UV light than lower portions of the first ILD 94.

More impurities may be removed from the upper portions of the first ILD 94 than the lower portions of the first ILD 94, such that the concentration of the impurities in the first ILD 94 increases in a direction extending from the top of the first ILD 94 to the bottom of the first ILD 94.

The anneal process is performed after the ozone curing process (if performed) and the UV curing process. In some embodiments the anneal process is a wet anneal performed using steam ($H_2O$) as the process gas, although other process gases may be used. The process gas (e.g., $H_2O$) can be produced by in-situ steam generation (ISSG), although other techniques may be used to produce the process gas. The anneal process drives oxygen from the process gas (e.g., water/steam) into the first ILD 94, where it bonds with the open bonds of silicon atoms that were generated by the ozone curing process and/or the UV curing process, thereby increasing the oxygen density of the first ILD 94. The anneal process is performed at a high temperature, to promote the formation of Si—O bonds. In some embodiments, the anneal process is performed at a temperature of from about 500° C. to about 900° C., and for a duration of from about 5 seconds to about 300 seconds.

After the oxide curing process 96, the first ILD 94 has a low concentration of impurities. For example, when the first ILD 94 is formed with H impurities, the final H dosage in the first ILD 94 can be in the range of 5E15 $cm^{-3}$ to about 4E18 $cm^{-3}$, with silicon-bonded impurities (e.g., Si—H bonds) accounting for less than about 0.9% of the first ILD 94. More specifically, in some embodiments, the final H dosage in the first ILD 94 can be in the range of 1E18 $cm^{-3}$ to about 4E18 $cm^{-3}$. Reducing impurities in the first ILD 94 enhances its barrier ability, reducing contamination diffusion paths to the epitaxial source/drain regions 88 (e.g., through the first ILD 94). Oxidation of the epitaxial source/drain regions 88 in subsequent processing can thus be avoided or reduced, which can improve the performance of the FinFETs.

It should be appreciated that oxide curing process 96 may be performed to reduce, but not eliminate, the impurities in the first ILD 94, and doing so can reduce, but not eliminate, oxidation of the epitaxial source/drain regions 88. In some embodiments, the impurity concentration of the first ILD 94 is still greater than the impurity concentration of the second ILD 98 after the oxide curing process 96. For example, the second ILD 98 may have substantially zero impurities, while the first ILD 94 may (or may not) have a non-zero concentration of impurities. The final impurity concentration of the first ILD 94 is determined by the parameters of the oxide curing process 96, which may be selected to be in the ranges discussed herein. Such parameters can allow the oxide curing process 96 to achieve a desired processing time while still reducing the quantity of impurities in the first ILD 94 enough that the epitaxial source/drain regions 88 have their desired performance. Selection of parameters outside of the ranges discussed herein may not allow the oxide curing process 96 to achieve a desired processing time or impurity reduction. In some embodiments, the epitaxial source/drain regions 88 may still oxidize, but the final oxygen dosage of the epitaxial source/drain regions 88 is very low, such as less than about 4E18 $cm^{-3}$.

Figure 10B:
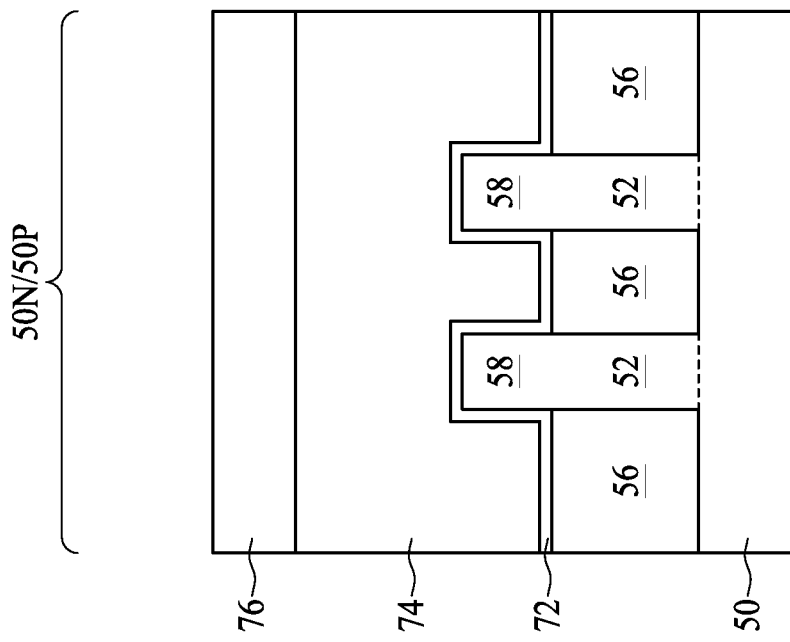
Figure 10A:
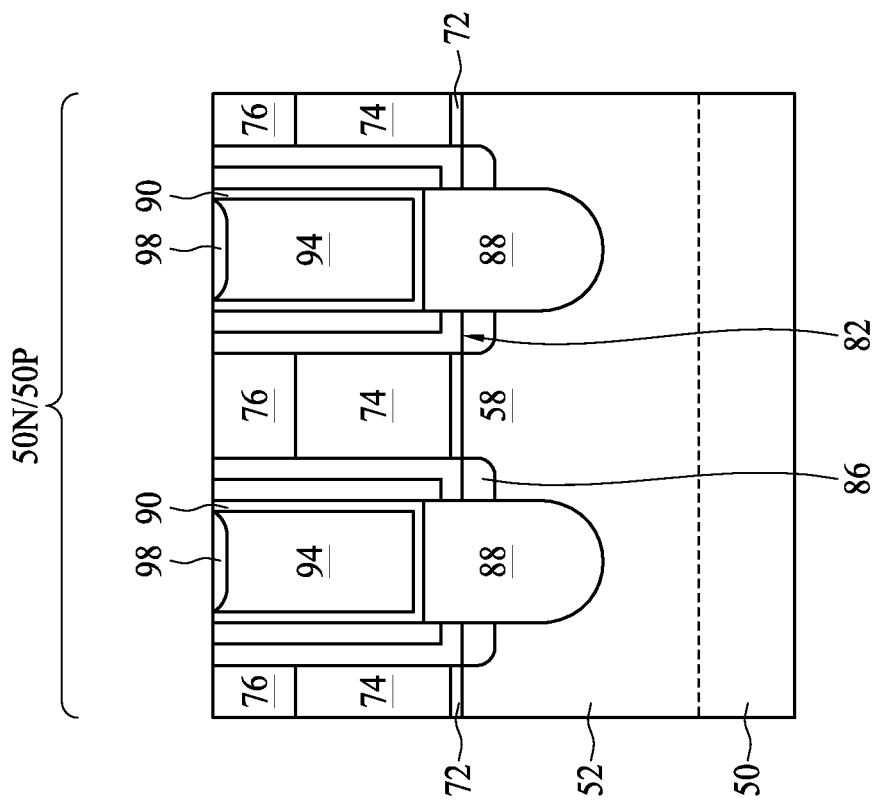

In FIGS. 10A and 10B, a planarization process, such as a CMP, may be performed to level the top surfaces of the second ILD 98 with the top surfaces of the dummy gates 74 or the masks 76. The planarization process may also remove the masks 76 on the dummy gates 74, and portions of the gate spacers 82 along sidewalls of the masks 76. After the planarization process, top surfaces of the second ILD 98, the gate spacers 82, and the masks 76 (if present) or the dummy gates 74 are coplanar (within process variations). Accordingly, the top surfaces of the masks 76 (if present) or the dummy gates 74 are exposed through the second ILD 98. After the planarization, the first ILD 94 can be thicker than the second ILD 98. For example, the second ILD 98 may have a thickness in the range of about 10 nm to about 100 nm.

In FIGS. 11A and 11B, the masks 76 (if present) and the dummy gates 74 are removed in one or more etching step(s), so that recesses 100 are formed. Portions of the dummy dielectrics 72 in the recesses 100 may also be removed. In some embodiments, only the dummy gates 74 are removed and the dummy dielectrics 72 remain and are exposed by the recesses 100. In some embodiments, the dummy dielectrics 72 are removed from recesses 100 in a first region of a die (e.g., a core logic region) and remain in recesses 100 in a second region of the die (e.g., an input/output region). In some embodiments, the dummy gates 74 are removed by an anisotropic dry etch process. For example, the etching process may include a dry etch process using reaction gas(es) that selectively etch the dummy gates 74 at a faster rate than the second ILD 98, the first ILD 94, or the gate spacers 82 (e.g., the first spacer layers 80A, see FIG. 5A). Each recess 100 exposes and/or overlies a channel region 58 of a respective fin 52. During the removal, the dummy dielectrics 72 may be used as etch stop layers when the dummy gates 74 are etched. The dummy dielectrics 72 may then be optionally removed after the removal of the dummy gates 74.

Figure 12B:
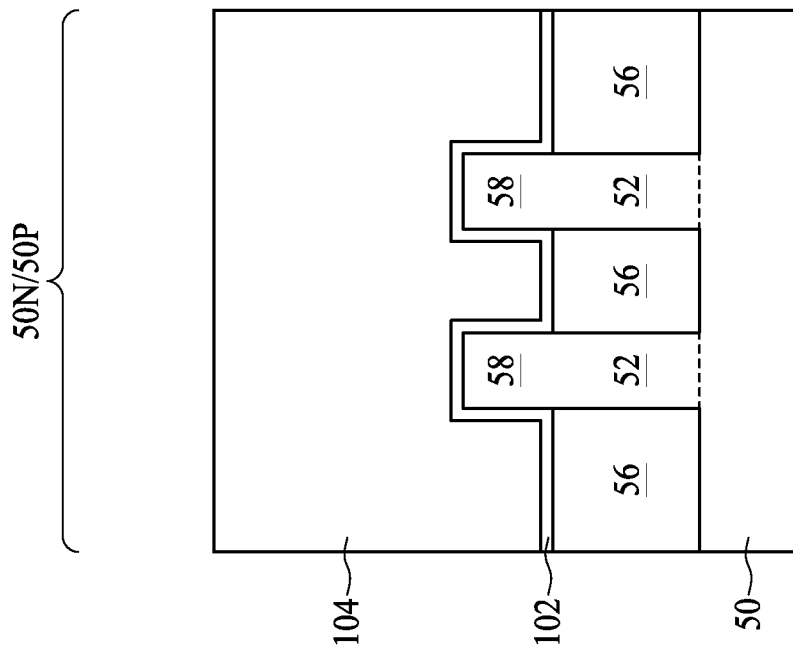
Figure 12A:
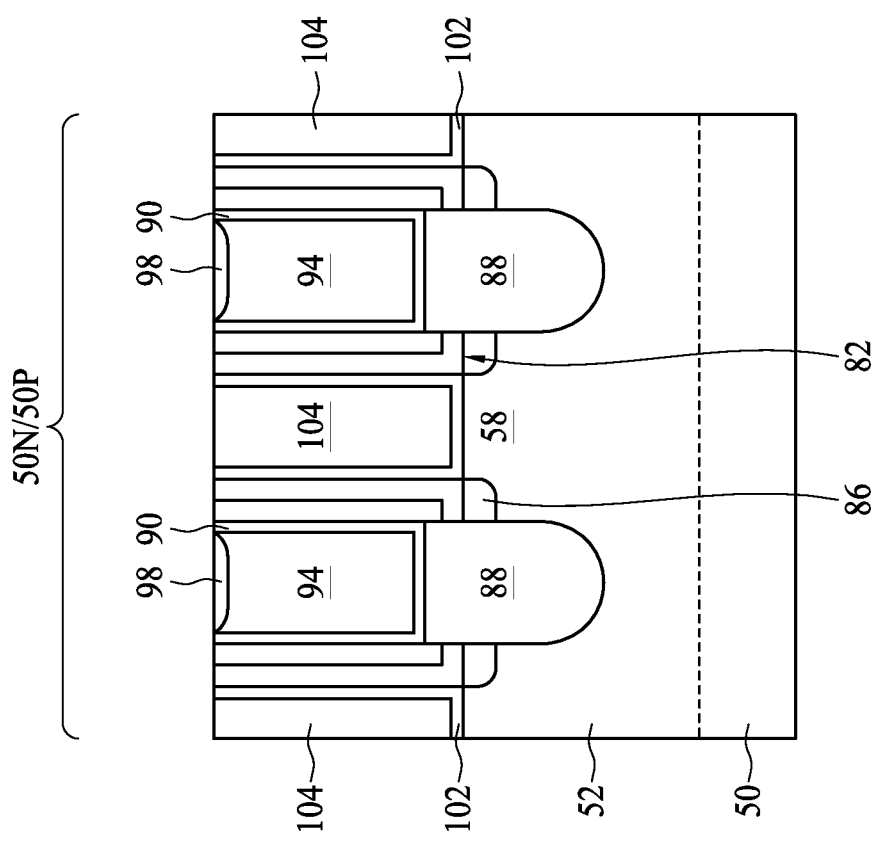

In FIGS. 12A and 12B, gate dielectrics 102 and gate electrodes 104 are formed for replacement gates. The gate dielectrics 102 include one or more layers deposited in the recesses 100, such as on the top surfaces and the sidewalls of the fins 52 and on sidewalls of the gate spacers 82. The gate dielectrics 102 may also be formed on the top surfaces of the second ILD 98. In some embodiments, the gate dielectrics 102 comprise one or more dielectric layers, such as one or more layers of silicon oxide, silicon nitride, metal oxide, metal silicate, or the like. For example, in some embodiments, the gate dielectrics 102 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectrics 102 may include a dielectric layer having a k-value greater than about 7.0. The formation methods of the gate dielectrics 102 may include Molecular-Beam Deposition (MBD), ALD, PECVD, and the like. In embodiments where portions of the dummy dielectrics 72 remain in the recesses 100, the gate dielectrics 102 include a material of the dummy dielectrics 72 (e.g., silicon oxide).

The gate electrodes 104 are deposited over the gate dielectrics 102, respectively, and fill the remaining portions of the recesses 100. The gate electrodes 104 may include a metal-containing material such as titanium nitride, titanium oxide, tantalum nitride, tantalum carbide, cobalt, ruthenium, aluminum, tungsten, combinations thereof, or multi-layers thereof. For example, although single layered gate electrodes 104 are illustrated, the gate electrodes 104 may include any number of liner layers, any number of work function tuning layers, and a fill material. After the filling of the recesses 100, a planarization process, such as a CMP, may be performed to remove the excess portions of the gate dielectrics 102 and the material of the gate electrodes 104, which excess portions are over the top surfaces of the second ILD 98. The top surfaces of the second ILD 98, the gate spacers 82, and the gate electrodes 104 are thus coplanar (within process variations). The remaining portions of material of the gate electrodes 104 and the gate dielectrics 102 thus form replacement gates of the resulting FinFETs. The gate dielectrics 102 and the gate electrodes 104 may each be collectively referred to as a "gate structure." The gate structures each extend along sidewalls of a channel region 58 of the fins 52.

The formation of the gate dielectrics 102 in the n-type region 50N and the p-type region 50P may occur simultaneously such that the gate dielectrics 102 in each region are formed from the same materials, and the formation of the gate electrodes 104 may occur simultaneously such that the gate electrodes 104 in each region are formed from the same materials. In some embodiments, the gate dielectrics 102 in each region may be formed by distinct processes, such that the gate dielectrics 102 may be different materials, and/or the gate electrodes 104 in each region may be formed by distinct processes, such that the gate electrodes 104 may be different materials. Various masking steps may be used to mask and expose appropriate regions when using distinct processes.

Figure 13B:
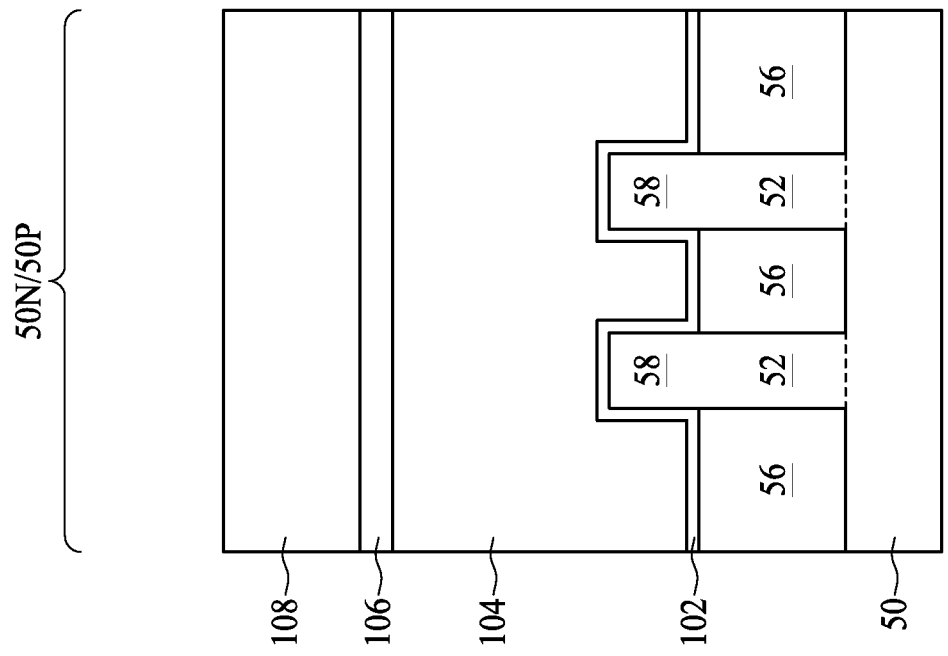
Figure 13A:
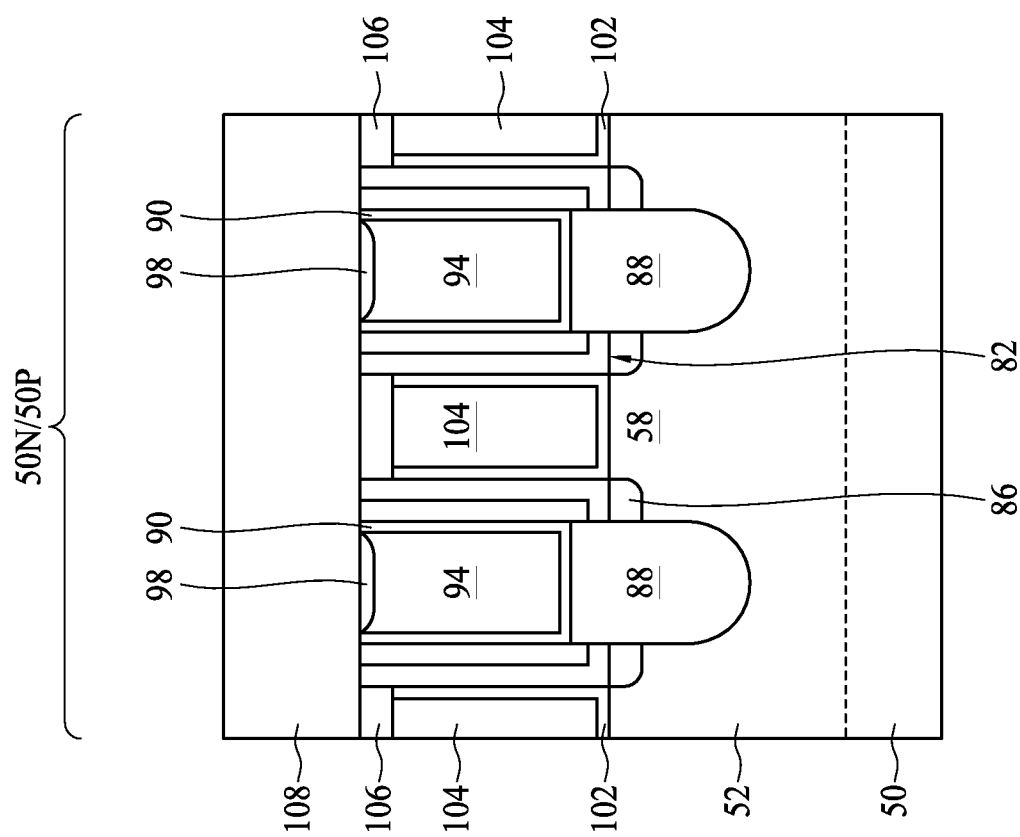

In FIGS. 13A and 13B, a third ILD 108 is deposited over the gate spacers 82, the second ILD 98, the gate dielectrics 102, and the gate electrodes 104. In some embodiments, the third ILD 108 is a flowable film formed by a flowable CVD method. In some embodiments, the third ILD 108 is formed of a dielectric material such as PSG, BSG, BPSG, USG, or the like, and may be deposited by any suitable method, such as CVD and PECVD.

Optionally, gate masks 106 are formed over the gate structures (including the gate dielectrics 102 and the corresponding gate electrodes 104) before formation of the third ILD 108. The gate masks 106 are disposed between opposing portions of the gate spacers 82. In some embodiments, forming the gate masks 106 includes recessing the gate structures so that recesses are formed directly over the gate structures and between opposing portions of gate spacers 82. One or more layers of dielectric material, such as silicon nitride, silicon oxynitride, or the like, are filled in the recesses, followed by a planarization process to remove excess portions of the dielectric material extending over the second ILD 98. The gate masks 106 include the portions of the dielectric material remaining in the recesses. Subsequently formed gate contacts will penetrate through the gate masks 106 and the third ILD 108 to contact the top surfaces of the recessed gate electrodes 104.

Figure 14B:
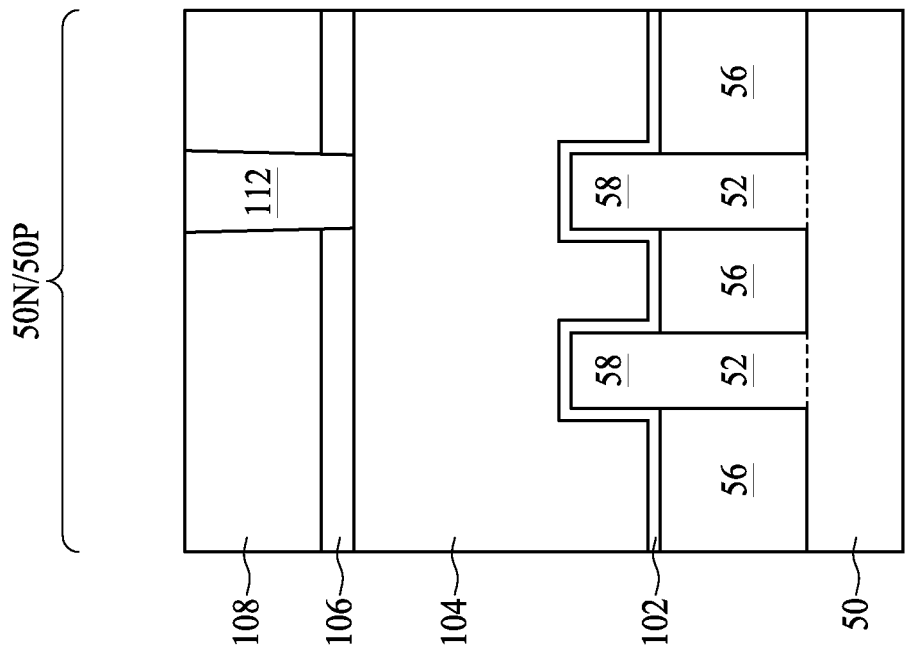
Figure 14A:
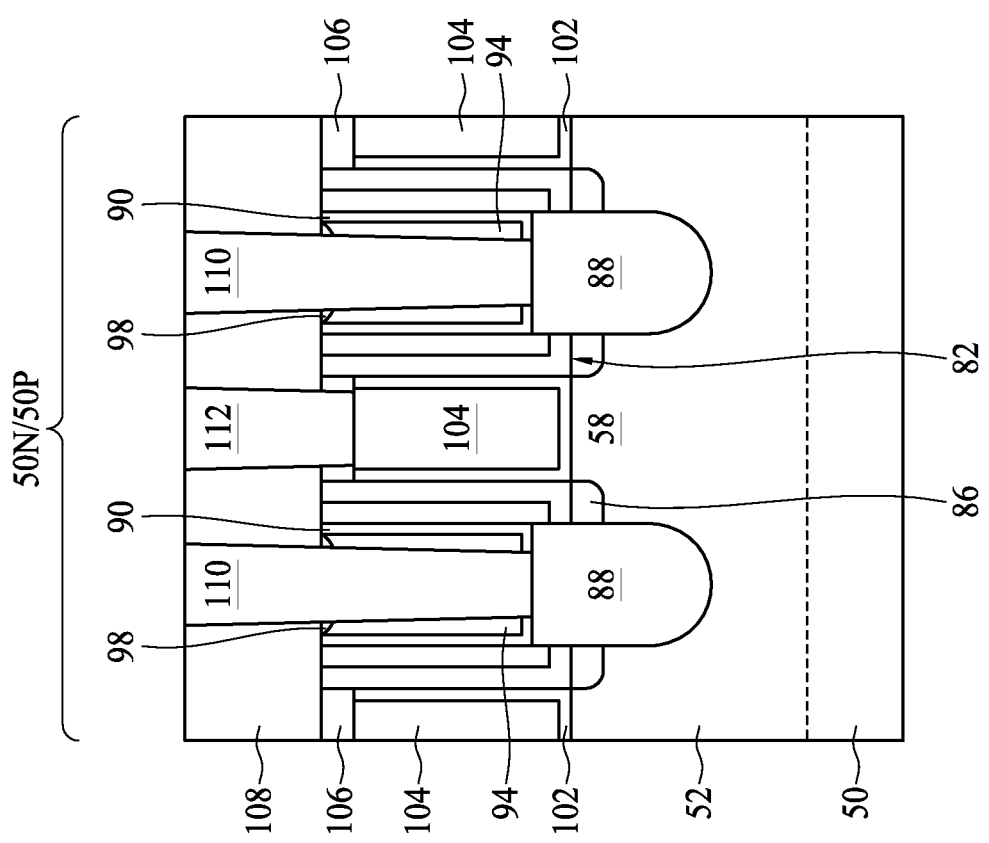

In FIGS. 14A and 14B, source/drain contacts 110 and gate contacts 112 are formed to contact, respectively, the epitaxial source/drain regions 88 and the gate electrodes 104. Openings for the source/drain contacts 110 are formed through the CESL 90, the first ILD 94, the second ILD 98, and the third ILD 108, and openings for the gate contacts 112 are formed through the gate masks 106 and the third ILD 108. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the third ILD 108. The remaining liner and conductive material form the source/drain contacts 110 and the gate contacts 112 in the openings. An anneal process may be performed to form a silicide at the interface between the epitaxial source/drain regions 88 and the source/drain contacts 110. The source/drain contacts 110 are physically and electrically coupled to the epitaxial source/drain regions 88, and the gate contacts 112 are physically and electrically coupled to the gate electrodes 104. The source/drain contacts 110 and the gate contacts 112 may be formed in different processes, or may be formed in the same process. Although shown as being formed in the same cross-sections, it should be appreciated that each of the source/drain contacts 110 and the gate contacts 112 may be formed in different cross-sections, which may avoid shorting of the contacts.

Figure 15B:
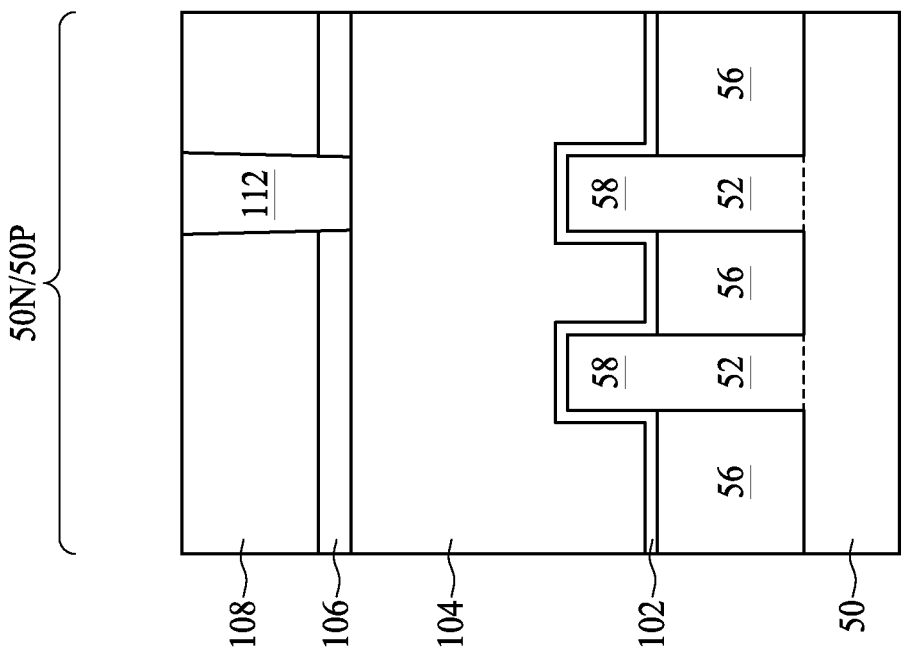
FIGS. 15A and 15B are cross-sectional views of FinFETs, in accordance with some other embodiments.
Figure 15A:
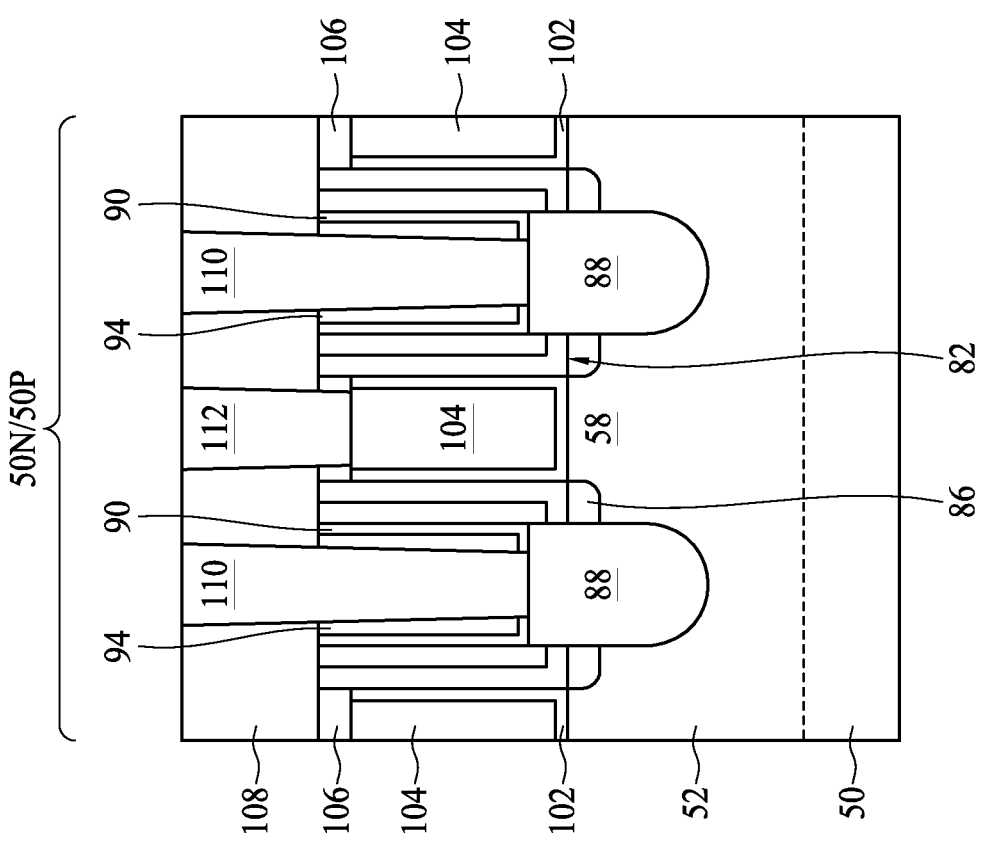

FIGS. 15A and 15B are cross-sectional views of FinFETs, in accordance with some other embodiments. This embodiment is similar to the embodiment of FIGS. 14A and 14B, except portions of the second ILD 98 do not remain over the epitaxial source/drain regions 88. As an example to form this embodiment, the first ILD 94 can also be formed over the dummy gates 74 such that portions of the first ILD 94 are disposed between the dummy gates 74 and the second ILD 98 during the processing step described with respect to FIGS. 8A through 8B. Thus, the planarization process removes all of the second ILD 98 and the portions of the first ILD 94 over the dummy gates 74 during the processing step described with respect to FIGS. 10A through 10B. The top surfaces of the first ILD 94, the gate spacers 82, and the gate electrodes 104 are thus coplanar (within process variations).

Figure 16B:
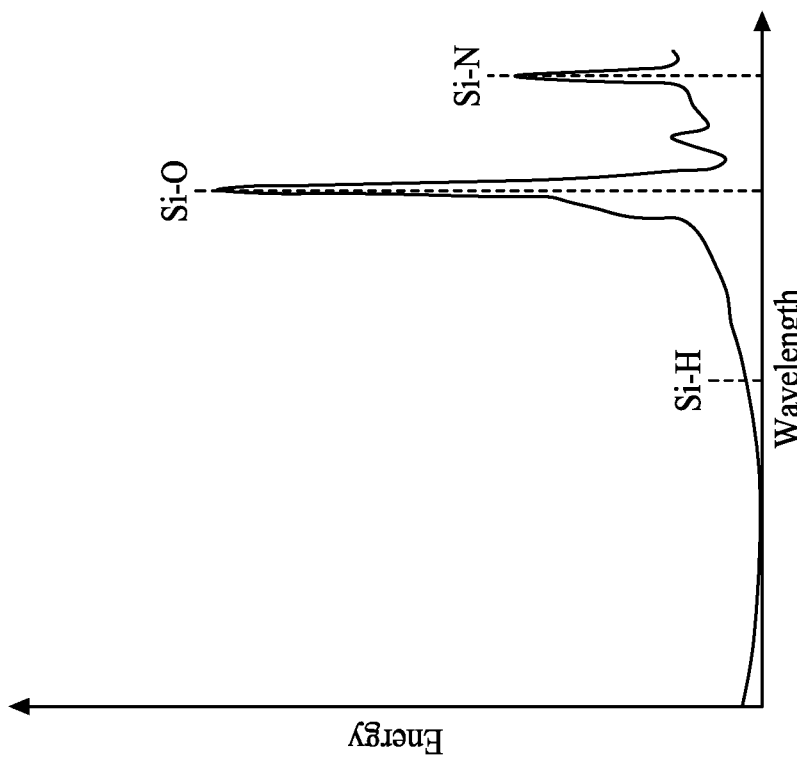
FIGS. 16A and 16B are spectrograms showing the compositions of inter-layer dielectrics, in accordance with some other embodiments.
Figure 16A:
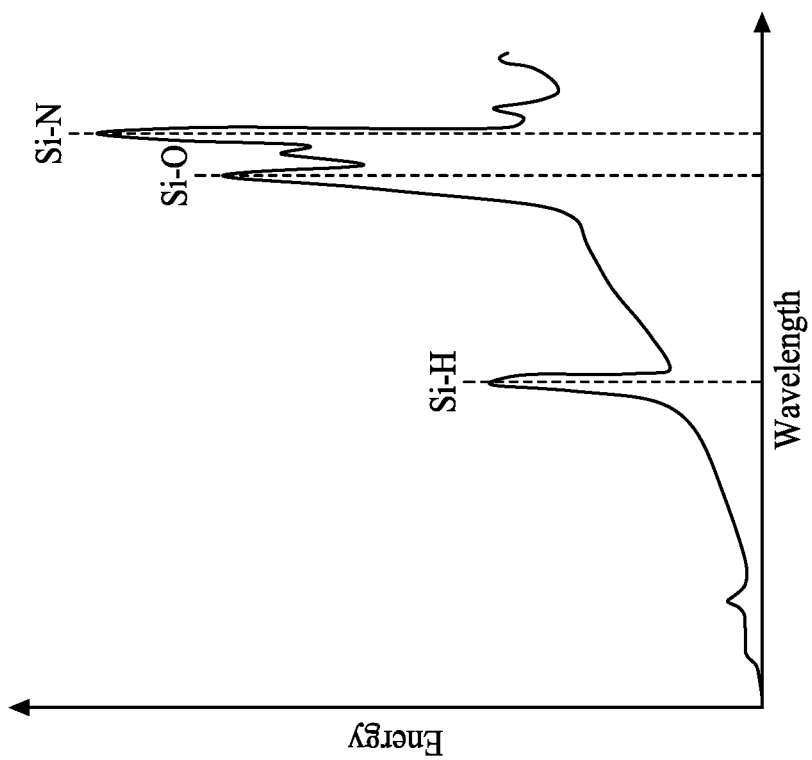

FIGS. 16A and 16B are spectrograms showing the composition of the first ILD 94 at various steps of processing. FIG. 16A shows the initial composition of the first ILD 94 after deposition, and FIG. 16B shows the final composition of the first ILD 94 after the oxide curing process 96. In this example, the first ILD 94 contains H and N impurities, which are bonded to silicon atoms of the first ILD 94 to form Si—H bonds and Si—N bonds. As shown, the quantity of Si—H bonds and Si—N bonds measured in the first ILD 94 are significantly decreased by the oxide curing process 96.

Embodiments may achieve advantages. Treating the CESL 90 with the nitridation treatment process 92 (discussed above for FIGS. 7A and 7B) before deposition of the first ILD 94 can help increase adhesion of the first ILD 94 to the CESL 90. Nitrating the CESL 90 can also help avoid or reduce oxidation of underlying features, e.g., the epitaxial source/drain regions 88 during deposition of the first ILD 94. Removing impurities from the first ILD 94 with the oxide curing process 96 (discussed above for FIGS. 9A and 9B) can enhance the electrical isolation performance of the first ILD 94. The barrier ability of the first ILD 94 can also be improved by the oxide curing process 96, which can help avoid or reduce oxidation of underlying features, e.g., the epitaxial source/drain regions 88 in subsequent processing. In some embodiments, the final oxygen dosage of the epitaxial source/drain regions 88 is less than about 4E18 cm$^{-3}$. The performance of the FinFETs may thus be improved.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate structures and source/drain regions are formed in a manner similar to the above-described embodiments. After the dummy gate structures are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

In an embodiment, a device includes: a gate structure over a substrate; a gate spacer adjacent the gate structure; a source/drain region adjacent the gate spacer; a first inter-layer dielectric (ILD) on the source/drain region, the first ILD having a first concentration of an impurity; and a second ILD on the first ILD, the second ILD having a second concentration of the impurity, the second concentration being less than the first concentration, top surfaces of the second ILD, the gate spacer, and the gate structure being coplanar; and a source/drain contact extending through the second ILD and the first ILD, the source/drain contact coupled to the source/drain region.

In some embodiments of the device, the first concentration of the impurity decreases through the first ILD in a direction extending from a top of the first ILD to a bottom of the first ILD. In some embodiments of the device, the second concentration of the impurity is zero. In some embodiments of the device, the first ILD is disposed in gaps around the source/drain region, and the second ILD extends along a top surface of the first ILD. In some embodiments of the device, a thickness of the first ILD is greater than a thickness of the second ILD.

In an embodiment, a device includes: a gate structure over a substrate; a source/drain region adjacent the gate structure; a gate spacer between the source/drain region and the gate structure, the gate spacer including a first spacer layer and a second spacer layer, the first spacer layer proximate the gate structure, the first spacer layer including silicon oxycarbonitride having a first atomic percent of nitrogen, the second spacer layer proximate the source/drain region, the second spacer layer including silicon oxycarbonitride having a second atomic percent of nitrogen, the first atomic percent greater than the second atomic percent; an etch stop layer on a sidewall of the gate spacer and a top surface of the source/drain region, the etch stop layer including silicon nitride having a third atomic percent of nitrogen, the third atomic percent greater than the first atomic percent; a first inter-layer dielectric (ILD) on the etch stop layer; and a source/drain contact extending through the first ILD and the etch stop layer, the source/drain contact coupled to the source/drain region.

In some embodiments of the device, the first atomic percent is in a range of 10 atomic percent to 45 atomic percent, the second atomic percent is in a range of 10 atomic percent to 45 atomic percent, and the third atomic percent is in a range of 15 atomic percent to 55 atomic percent. In some embodiments of the device, top surfaces of the first ILD, the gate spacer, and the gate structure are coplanar. In some embodiments of the device, the first ILD has a first concentration of an impurity, and the device further includes: a second ILD on the first ILD, the second ILD having a second concentration of the impurity, the second concentration being less than the first concentration, the source/drain contact extending through the second ILD, top surfaces of the second ILD, the gate spacer, and the gate structure being coplanar.

In an embodiment, a method includes: forming a gate structure over a substrate; forming a gate spacer adjacent the gate structure; growing a source/drain region adjacent the gate spacer; depositing an etch stop layer on the source/drain region, the gate spacer, and the gate structure, the etch stop layer having a nitrogen concentration; performing a nitridation treatment process on the etch stop layer, the nitridation treatment process increasing the nitrogen concentration of the etch stop layer; depositing a first inter-layer dielectric (ILD) on the etch stop layer, the first ILD having an impurity concentration; and performing an oxide curing process on the first ILD, the oxide curing process decreasing the impurity concentration of the first ILD.

In some embodiments of the method, the nitridation treatment process includes an ammonia soak process. In some embodiments of the method, the nitridation treatment process includes a nitrogen radical treatment process. In some embodiments of the method, forming the gate spacer includes: depositing a first spacer layer on a sidewall of the gate structure and a top surface of the source/drain region, the first spacer layer having a nitrogen concentration; and depositing a second spacer layer on the first spacer layer, the second spacer layer having a nitrogen concentration, the nitrogen concentration of the second spacer layer being less than the nitrogen concentration of the first spacer layer, the nitridation treatment process increasing the nitrogen concentration of the second spacer layer. In some embodiments of the method, the first ILD includes an impurity bonded to silicon, and the oxide curing process includes: exposing the first ILD to ultraviolet light, the ultraviolet light breaking bonds between the silicon and the impurity; and annealing the first ILD with a wet anneal, the wet anneal forming bonds between the silicon and oxygen. In some embodiments of the method, the oxide curing process further includes: exposing the first ILD to ozone, the ozone breaking bonds between the silicon and the impurity. In some embodiments of the method, exposing the first ILD to the ultraviolet light is performed at a temperature in a range of 4° C. to 80° C., exposing the first ILD to the ozone is performed at a temperature in a range of 50° C. to 500° C., and annealing the first ILD is performed at a temperature in a range of 50° C. to 900° C. In some embodiments, the method further includes: depositing a second ILD over the first ILD, the second ILD having an impurity concentration, the impurity concentration of the second ILD being less than the impurity concentration of the first ILD, the second ILD covering the first ILD while the first ILD is exposed to the ultraviolet light. In some embodiments of the method, the second ILD and the first ILD each include silicon oxide, where depositing the first ILD includes performing flowable chemical vapor deposition using trisilane amine, and where depositing the second ILD includes performing chemical vapor deposition using tetraethyl orthosilicate. In some embodiments, the method further includes: forming a source/drain contact through the second ILD and the first ILD, the source/drain contact coupled to the source/drain region. In some embodiments, the method further includes: after the oxide curing process, removing the second ILD; and forming a source/drain contact through the first ILD, the source/drain contact coupled to the source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a gate structure over a substrate;
    forming a gate spacer adjacent the gate structure;
    growing a source/drain region adjacent the gate spacer;
    depositing an etch stop layer on the source/drain region, the gate spacer, and the gate structure, the etch stop layer having a nitrogen concentration;
    performing a nitridation treatment process on the etch stop layer, the nitridation treatment process increasing the nitrogen concentration of the etch stop layer;
    depositing a first inter-layer dielectric (ILD) on the etch stop layer, the first ILD having an impurity concentration; and
    performing an oxide curing process on the first ILD, the oxide curing process decreasing the impurity concentration of the first ILD.

2. The method of claim 1, wherein the nitridation treatment process comprises an ammonia soak process.

3. The method of claim 1, wherein the nitridation treatment process comprises a nitrogen radical treatment process.

4. The method of claim 1, wherein forming the gate spacer comprises:
    depositing a first spacer layer on a sidewall of the gate structure and a top surface of the source/drain region, the first spacer layer having a nitrogen concentration; and
    depositing a second spacer layer on the first spacer layer, the second spacer layer having a nitrogen concentration, the nitrogen concentration of the second spacer layer being less than the nitrogen concentration of the first spacer layer, the nitridation treatment process increasing the nitrogen concentration of the second spacer layer.

5. The method of claim 1, wherein the first ILD comprises an impurity bonded to silicon, and the oxide curing process comprises:
    exposing the first ILD to ultraviolet light, the ultraviolet light breaking bonds between the silicon and the impurity; and
    annealing the first ILD with a wet anneal, the wet anneal forming bonds between the silicon and oxygen.

6. The method of claim 5, wherein the oxide curing process further comprises:
    exposing the first ILD to ozone, the ozone breaking bonds between the silicon and the impurity.

7. The method of claim 6, wherein exposing the first ILD to the ultraviolet light is performed at a temperature in a range of 4° C. to 80° C., exposing the first ILD to the ozone is performed at a temperature in a range of 50° C. to 500° C., and annealing the first ILD is performed at a temperature in a range of 500° C. to 900° C.

8. The method of claim 5 further comprising:
    depositing a second ILD over the first ILD, the second ILD having an impurity concentration, the impurity concentration of the second ILD being less than the impurity concentration of the first ILD, the second ILD covering the first ILD while the first ILD is exposed to the ultraviolet light.

9. The method of claim 8, wherein the second ILD and the first ILD each comprise silicon oxide, wherein depositing the first ILD comprises performing flowable chemical vapor deposition using trisilane amine, and wherein depositing the second ILD comprises performing chemical vapor deposition using tetraethyl orthosilicate.

10. The method of claim 8 further comprising:
    forming a source/drain contact through the second ILD and the first ILD, the source/drain contact coupled to the source/drain region.

11. The method of claim 8 further comprising:
    after the oxide curing process, removing the second ILD; and
    forming a source/drain contact through the first ILD, the source/drain contact coupled to the source/drain region.

12. A method comprising:
depositing an etch stop layer on a source/drain region, the etch stop layer having a nitrogen concentration;
increasing the nitrogen concentration of the etch stop layer by treating the etch stop layer;
after treating the etch stop layer, depositing an inter-layer dielectric on the etch stop layer, the inter-layer dielectric having an impurity concentration;
decreasing the impurity concentration of the inter-layer dielectric by curing the inter-layer dielectric; and
forming a source/drain contact through the inter-layer dielectric and the etch stop layer, the source/drain contact coupled to the source/drain region.

13. The method of claim 12, wherein treating the etch stop layer comprises:
soaking the etch stop layer in ammonia.

14. The method of claim 12, wherein treating the etch stop layer comprises:
exposing the etch stop layer to nitrogen free radicals.

15. The method of claim 12, wherein curing the inter-layer dielectric comprises:
exposing the inter-layer dielectric to ultraviolet light; and
annealing the inter-layer dielectric.

16. The method of claim 15, wherein curing the inter-layer dielectric further comprises:
exposing the inter-layer dielectric to ozone.

17. A method comprising:
depositing an etch stop layer on a source/drain region;
depositing an inter-layer dielectric on the etch stop layer, the inter-layer dielectric comprising impurities bonded to silicon;
breaking bonds between the silicon and the impurities of the inter-layer dielectric by exposing the inter-layer dielectric to ultraviolet light;
outgassing the impurities;
forming bonds between oxygen and the silicon of the inter-layer dielectric by annealing the inter-layer dielectric; and
forming a source/drain contact through the inter-layer dielectric and the etch stop layer, the source/drain contact coupled to the source/drain region.

18. The method of claim 17 further comprising:
breaking bonds between the silicon and the impurities of the inter-layer dielectric by exposing the inter-layer dielectric to ozone.

19. The method of claim 17, wherein the inter-layer dielectric is covered with a dielectric layer while the inter-layer dielectric is exposed to ultraviolet light.

20. The method of claim 17 further comprising:
increasing a nitrogen concentration of the etch stop layer.

* * * * *